United States Patent [19]
Kobayashi et al.

[11] Patent Number: 5,631,189
[45] Date of Patent: May 20, 1997

[54] METHOD OF FORMING ELEMENT ISOLATION REGION

[75] Inventors: Toshio Kobayashi; Satoshi Nakayama, both of Kanagawa, Japan

[73] Assignee: Nippon Telegraph and Telephone Corporation, Japan

[21] Appl. No.: 499,704

[22] Filed: Jul. 7, 1995

[30] Foreign Application Priority Data

Jul. 13, 1994 [JP] Japan ................................ 6-161097

[51] Int. Cl.$^6$ .............................................. H01L 21/76
[52] U.S. Cl. ................................ 438/448; 438/440
[58] Field of Search ................................ 437/69, 70, 72, 437/73, 24

[56] References Cited

U.S. PATENT DOCUMENTS 4,016,007  4/1977  Wada et al. ................................ 437/69
4,541,167  9/1985  Havemann ................................ 148/50
5,192,707  3/1993  Hodges et al. ............................ 437/70
5,338,750  8/1994  Tuan et al. ................................ 437/69
5,397,732  3/1995  Chen ........................................ 437/69

OTHER PUBLICATIONS

"Isolation Process Using Polysilicon Buffer Layer for Scaled MOS/VLSI" Yu–Pin Han et al, Extended Abstracts vol. 84–1, Spring Meeting, Cincinnati, Ohio, May 6–11, 1984.

*Primary Examiner*—Trung Dang
*Attorney, Agent, or Firm*—Blakely Sokoloff Taylor & Zafman

[57] ABSTRACT

According to this method, before a silicon nitride ($Si_3N_4$) layer having a thickness of about 200 nm and serving as a field oxidation (selective oxidation) mask is formed, nitrogen-doped amorphous silicon is deposited to form a silicon layer having a thickness of about 50 nm and serving as an underlying layer of the silicon nitride layer.

20 Claims, 16 Drawing Sheets

METHOD OF FORMING ELEMENT ISOLATION REGION

BACKGROUND OF THE INVENTION

The present invention relates to a method of forming an element isolation region in a semiconductor device.

In a silicon semiconductor integrated circuit, an active area prospectively serving as an element is surrounded by an element isolation region covered with a relatively thick field oxide film to be isolated from other active areas.

As a method of forming this field oxide film, a poly-buffered LOCOS (Local Oxidation of Silicon) method is available.

FIGS. 6A to 6K explain this poly-buffered LOCOS method.

First of all, as shown in FIG. 6A, a thin oxide film 21 is formed on the surface of a silicon substrate 1. As shown in FIG. 6B, a silicon layer 31b consisting of undoped polysilicon is formed on the thin oxide film 21.

As shown in FIG. 6C, a silicon nitride layer 4 is formed on the silicon layer 31b.

As shown in FIGS. 6D and 6E, a resist pattern 5 is formed by using a lithographic technique. The silicon nitride layer 4 is partly etched by using this resist pattern as an etching mask to form a silicon nitride mask 4a.

Subsequently, the resist pattern 5 is removed, as shown in FIG. 6F, and the silicon layer 31b as a buffer layer and the silicon substrate 1 are selectively oxidized by thermal oxidation using the silicon nitride mask 4a to form a thick oxide film 22c, as shown in FIG. 6G.

In this case, owing to the presence of the silicon layer 31b, the stress acting on the silicon substrate 1 is reduced. In addition, the stress produced in the silicon substrate 1 is also reduced by decreasing the oxidation amount of the silicon substrate 1 in forming a field oxide film.

By removing the silicon nitride mask 4a and the remaining silicon layer 31b laid without being oxidized under the silicon nitride mask 4a, an element isolation region covered with the thick oxide film 22c is formed, as shown in FIG. 6J.

In the poly-buffered LOCOS method described above, the silicon layer 31b in the region to be selectively oxidized is used without being etched. However, this method is not limited to such a technique, and the following technique may be used.

FIGS. 7A to 7L explain steps in forming a field oxide film by another example of the poly-buffered LOCOS method.

First of all, as shown in FIG. 7A, a thin oxide film 21 is formed on a silicon substrate 1. As shown in FIG. 7B, a silicon layer 31c consisting of undoped polysilicon is then formed on the thin oxide film 21.

By inserting the undoped polysilicon film between the thin oxide film 21 and a silicon nitride mask 4a (to be described later), the stress acting on the silicon substrate 1 in performing selective oxidation can be reduced.

As shown in FIG. 7C, a silicon nitride layer 4 is formed on the silicon layer 31c.

Subsequently, as shown in FIGS. 7D to 7F, a resist pattern 5 is formed by using a lithographic technique. The silicon nitride layer 4 and the silicon layer 31c other than the portions laid below the resist pattern 5 are sequentially removed by an etching technique using the resist pattern 5 as a mask.

And as shown in FIG. 7G, the resist pattern 5 is removed. After removing the resist pattern 5, as shown in FIG. 7H, a thick oxide film 22c is selectively formed on the silicon substrate 1 by thermal oxidation using the silicon nitride mask 4a as a mask.

Owing to the presence of the silicon layer 31c, the stress acting on the silicon substrate 1 is reduced.

When the silicon nitride mask 4a and the remaining silicon layer 31c laid without being oxidized under the silicon nitride mask 4a are removed, an element isolation region covered with thick oxide film 22c is formed, as shown in FIG. 7K.

The following problems are posed in the method shown in FIGS. 6A to 6I.

In the poly-buffered LOCOS method described above, as shown in FIGS. 6F and 6G, the silicon layer 31b consisting of undoped polysilicon is inserted between the thick silicon nitride mask 4a and the oxide film 21. For this reason, when the silicon layer 31b and the silicon substrate 1 are selectively oxidized by using the silicon nitride mask 4a, oxide regions called bird's beaks are formed at two positions between the silicon substrate 1 and the silicon layer 31b and between the silicon layer 31b and the silicon nitride mask 4a, as shown in FIG. 6G.

As a result, the cross-section of the field oxide film at the boundary of the element isolation region exhibits an overhang structure immediately after selective oxidation. In the subsequent steps, e.g., a gate electrode formation step, inconveniences such as disconnection at a stepped portion and non-etched residual portions occur.

Furthermore, in this poly-buffered LOCOS method, after selective oxidation of the silicon substrate 1, a void (hole) 9 may be formed in a portion, of the silicon layer 31b, on which stress intensively acts, as shown in FIGS. 6G to 6I. If this void 9 is formed, the thin oxide film 21 exposed to the bottom of the void 9 is etched when the silicon layer 31b is removed after selective oxidation. As shown in FIGS. 6J and 6K, when this thin oxide film 21 is etched, the silicon substrate 1 exposed through the void 9 may be etched. In such a state, if a diffusion layer is formed in a region including the etched portion of the thin oxide film 21 in the subsequent steps, the etched region may cause junction leakage. In addition, if a MOS gate electrode is formed on the thin oxide film 21, a normal channel cannot be formed, and a gate oxide film defect may be caused as well.

In order to prevent the formation of the void 9, it is conceivable that the thin oxide film 21 may be thickened. If, however, the thin oxide film 21 is thickened, a bird's beak region, which should be reduced, expands to reduce the effect of the poly-buffered LOCOS method.

In addition to the above problems, this poly-buffered LOCOS method involves a problem of the unevenness of the boundary (bird's beak end) of the field oxide film area between the active area and the thick oxide film 22c.

In this poly-buffered LOCOS method, in selectively oxidizing the exposed silicon layer 31b, since the oxidation rate is dependent on the plane orientation of each crystal grain of the silicon layer 31b, lateral oxidation from an end of the silicon nitride mask does not progress uniformly.

For this reason, as shown in FIGS. 6I and 6K, the boundary of the field oxide film area between the active area and the oxide film 22c becomes uneven. This makes it difficult to define a fine active area.

In addition, owing to the unevenness of this boundary, the breakdown voltage of a gate oxide film formed in the active area may vary.

Furthermore, in forming a gate electrode of a fine MOSFET with a size of 0.25 μm or less, this uneven boundary adversely affects pattern formation by lithography.

Similar to the above example, another example of the poly-buffered LOCOS method involves the following problems.

One of the problems is that a void (hole) 9 is formed in a portion, of the silicon layer 31c, on which stress intensively acts after selective oxidation of the silicon substrate 1, as shown in 7H.

If the void 9 is formed, as shown in FIGS. 6J and 6K as well, the thin oxide film 21 exposed to the bottom of the void 9 is etched when the silicon layer 31c is removed after selective oxidation.

Subsequently, as shown in FIGS. 7K and 7L, the silicon substrate 1 itself is exposed and etched. As a result, a hole 9a is formed in the silicon substrate 1.

As described above, if the thin oxide film 21 as a pad oxide film is thickened to prevent such a hole 9a, the bird's beak region, which should be reduced, expands to reduce the effect of the poly-buffered LOCOS method.

In addition, as shown in FIGS. 6I and 6K as well, the boundary (bird's beak end) of the field oxide area between the active region and the oxide film 22c becomes uneven, as shown in FIGS. 7J and 7L.

As in the above example, this uneven boundary makes it difficult to define a fine active area.

SUMMARY OF THE INVENTION

Therefore, it is a principal object of the present invention to provide an improved method of forming an element isolation region, which smoothes an element isolation region formed without forming any void in a silicon layer used to form the element isolation region by the poly-buffered LOCOS method.

It is another object to provide a method of forming an element isolation region for realizing the above objects without increasing the number of formation steps as compared with the conventional poly-buffered LOCOS method.

In order to achieve the above objects, according to an aspect of the present invention, there is provided a method of forming an element isolation region, comprising the steps of forming an oxide film on a semiconductor substrate, forming a silicon layer consisting of silicon doped with an impurity which prevents crystallization of silicon on the oxide film, forming a film having resistance to oxidation on the silicon layer, selectively removing part of the oxidation-resistant film to form a mask for oxidation consisting of the oxidation-resistant film, and forming an element isolation region by oxidizing the silicon layer and the semiconductor substrate by using the mask for oxidation as a mask.

DESCRIPTION OF THE PREFERRED EMBODIMENTS

Prior to a description of an embodiment of the present invention, the principle concept of the present invention will be described below.

In the present invention, a silicon layer to be formed under an oxide mask used for selective oxidation for the formation of a field oxide film is constituted by a microcrystalline polysilicon layer doped with nitrogen, carbon, and oxygen as impurities or an amorphous silicon layer doped with these impurities. In addition, this silicon layer may be a multilayer structure formed by combining layers doped with these impurities or these layers and undoped amorphous silicon layers. The microcrystalline polysilicon layer doped with these impurities exhibits slow growth of crystal grains even if the layer is annealed. The amorphous silicon layer doped with the impurities does not easily become a normal polycrystalline layer even if the layer is annealed. That is, this layer has a property of becoming a microcrystalline layer.

In high-temperature annealing, such as thermal oxidation, with a stress acting on a silicon film, silicon atoms constituting the silicon film cannot easily move, and hence formation of voids can be suppressed. Since crystal grains are small, oxidation progresses uniformly, and no uneven boundary portion is formed.

In addition, if nitrogen or carbon is used as an impurity, uniform oxidation can be realized, and the oxidation rate can be decreased as well. For this reason, the formation of voids, which poses a problem in the conventional methods, can be suppressed. Consequently, the problem of the unevenness of the boundary portion of a field oxide film can be solved, and a bird's beak region can be reduced.

Furthermore, the silicon layer may has a multilayer structure constituted by layers doped with different impurities, as described above, or the concentration of an impurity in the silicon layer may be changed in the direction of film thickness, thereby realizing control operations, e.g., moderating the cross-sectional shape of a field oxide film.

Embodiments of the present invention will be described below with reference to the accompanying drawings.

[Embodiment 1]

FIGS. 1A to 1J show the steps in manufacturing an element isolation structure to explain an embodiment of the present invention.

Figure 1A:
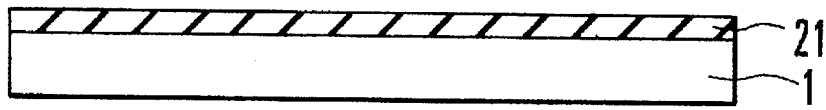
FIGS. 1A to 1J are views for explaining successive steps of an embodiment showing a method of forming an element isolation region of the present invention.

First of all, as shown in FIG. 1A, a thin oxide film 21 having a thickness of 6 to 12 nm is formed on a silicon substrate 1 by annealing in a dry oxygen atmosphere at 900° C. By forming the oxide film 21, the stress acting on the silicon substrate 1 based on the subsequent steps is reduced. The oxide film 21 is also served as an etching stopper in removing a silicon layer formed thereon.

Figure 1B:
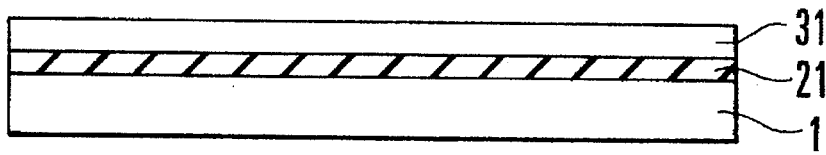

Subsequently, as shown in FIG. 1B, nitrogen-doped amorphous silicon is deposited on the oxide film 21 by using the CVD method to form a silicon layer 31 having a thickness of about 50 nm on the thin oxide film 21. In this step, the deposition temperature is set to be 500° C. and an ammonia gas is used in addition to $SiH_4$ or $Si_2H_6$. Nitrogen doping is performed simultaneously with the deposition of amorphous silicon. This nitrogen serves to prevent crystallization of silicon and decrease the oxidation rate.

Although nitrogen is used as an impurity doped in the silicon layer 31, carbon, oxygen, or the like may be used.

In this embodiment 1 and embodiments 2 to 7 to be described later, the CVD method is used as an example of the silicon layer deposition method or the impurity doping method. However, the silicon layer deposition method is not limited to the CVD method. For example, a sputtering method may be used to simultaneously perform deposition of a silicon layer and impurity doping.

An impurity such as nitrogen, carbon, or oxygen doped in the silicon layer 31 may have a concentration in the range of $1 \times 10^{21}$ cm$^{-3}$ to $3 \times 10^{22}$ cm$^{-3}$. If the doping amount of each of these impurities is smaller than $1 \times 10^{21}$ cm$^{-3}$, the effect of suppressing the growth of crystal grains is not so expected. In contrast to this, if the doping amount of each impurity exceeds $3 \times 10^{22}$ cm$^{-3}$, formation of a compound occurs rather than impurity doping. For example, if such a large amount of nitrogen is doped in the silicon layer 31, the silicon layer becomes a nitride film. A silicon layer serves to reduce the stress acting on a substrate in the step of forming a field oxide film. If, however, this silicon layer becomes a nitride film, no oxidation occurs. In addition, since the nitride film is very hard, the film cannot also serve to reduce the stress acting on the substrate. The same applies to a case wherein carbon is used. If the silicon layer 31 is doped with an excessive amount of oxygen, the layer becomes an oxide film. As a result, a silicon oxide film is formed on an unnecessary portion.

Figure 1C:
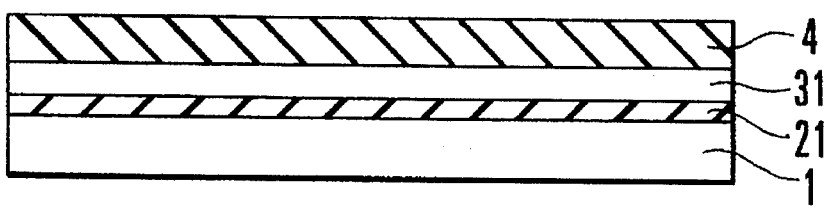
Figure 1D:
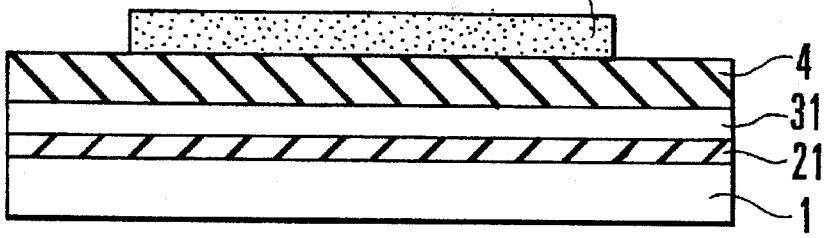

Subsequently, as shown in FIG. 1C, a silicon nitride layer ($Si_3N_4$) 4 having a thickness of about 200 nm and serving as a mask for field oxidation (selective oxidation) is formed. A photoresist layer is formed on the silicon nitride layer 4 and is patterned to form a resist pattern 5, as shown in FIG. 1D.

Note that a resist photosensitive to X-rays or an electron beam resist may be used instead of the photoresist layer, and the resist pattern 5 may be formed by a lithographic technique using an X-ray or electron beam.

Figure 1E:
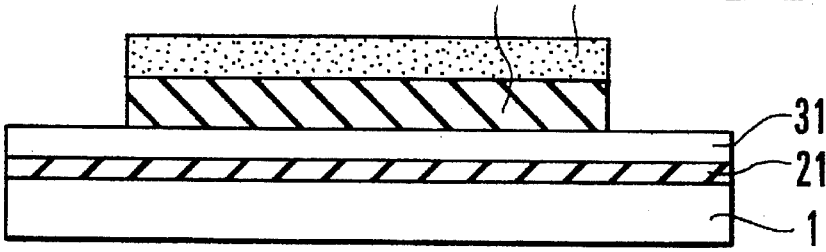

As shown in FIG. 1E, the silicon nitride layer 4 is etched by using the resist pattern 5 as a mask to form a silicon nitride mask (oxide mask) 4a. This etching is performed by the reactive ion etching (RIE) method using a carbon fluoride gas.

The silicon layer 31 other than the portion under the silicon nitride mask 4a is exposed by this etching.

Figure 1F:
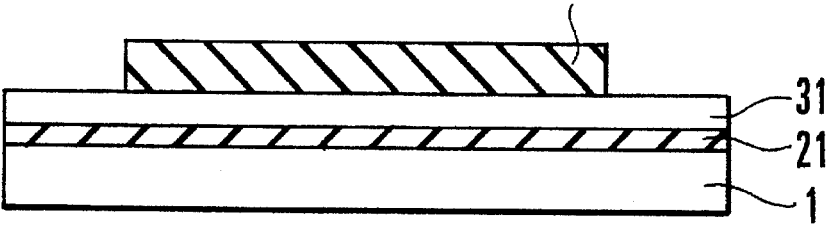

As shown in FIG. 1F, after the resist pattern 5 is removed by an ashing process using oxygen radicals, the resultant structure undergoes RCA cleaning based on a liquid treatment using a liquid mixture of ammonia and hydrogen peroxide and a liquid treatment using a liquid mixture of hydrogen peroxide and hydrochloric acid.

Figure 1G:
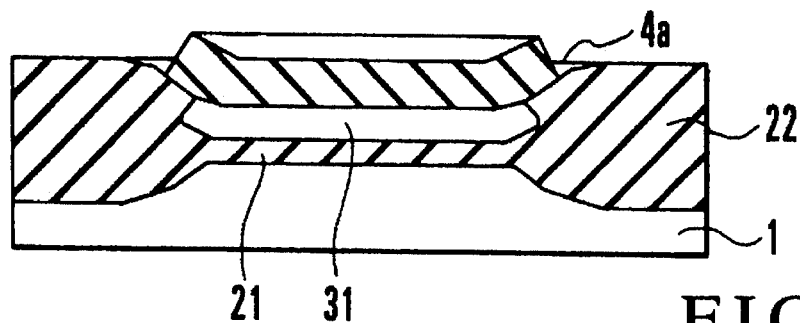

Subsequently, as shown in FIG. 1G, selective oxidation is performed by using the silicon nitride mask 4a as a mask in an oxygen atmosphere containing water vapor at a temperature of 1,000° C., thereby oxidizing the exposed silicon layer 31 and the surface of the silicon substrate 1. As a result, a thick oxide film 22 having a thickness of 450 nm is formed. An oxidation temperature of 1,000° C. is an example and may be changed within the range of, e.g., 700° to 1,150° C. without posing any problem.

A thin oxide film formed on the surface of the silicon nitride mask 4a is etched by using dilute hydrofluoric acid, and the silicon nitride mask 4a is selectively removed by using hot phosphoric acid.

Figure 1H:
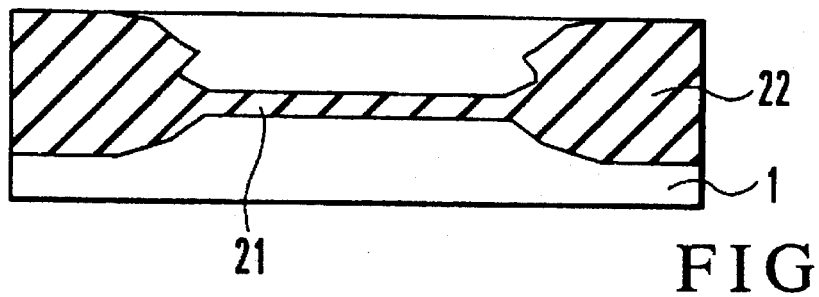

Furthermore, the silicon layer 31 is selectively removed by the RIE method using a chlorine-based gas to obtain the silicon substrate 1 on which an element isolation region covered with the thick oxide film 22 is formed, as shown in FIG. 1H.

Figure 1I:
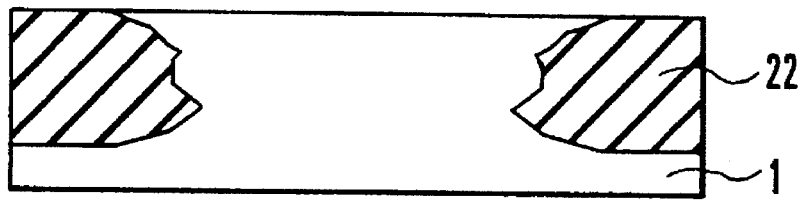

Finally, as shown in FIG. 1I, the thin oxide film 21 is removed to expose the surface of the silicon substrate 1 in the region surrounded by the thick oxide film 22.

Figure 1J:
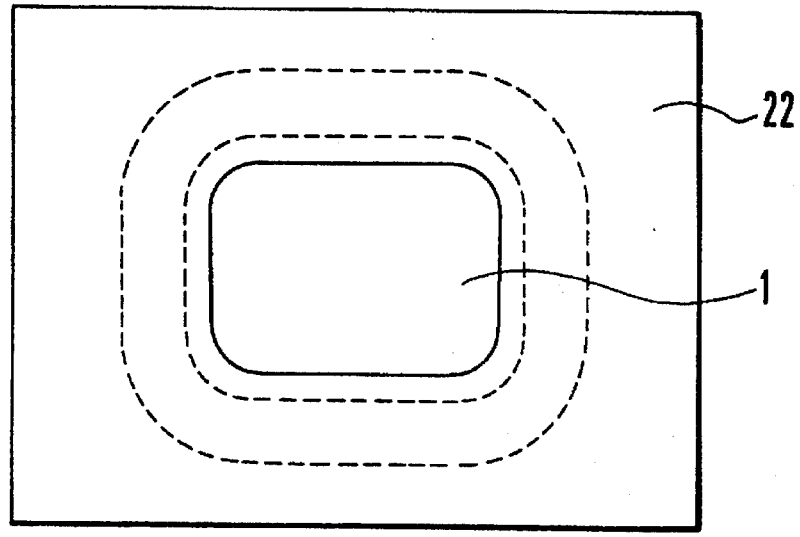

With this method, no void is formed in the silicon layer 31, and no hole is formed in the silicon substrate 1, as shown in FIG. 1J, unlike the conventional methods. In addition, the boundary portion of the oxide film 22 is free from an uneven state to form a smooth surface.

Since the silicon layer 31 is doped with an impurity at the time of the deposition of the silicon layer 31, the problems can be solved without increasing the number of manufacturing steps as compared with the conventional methods.

[Embodiment 2]

FIGS. 2A to 2J show manufacturing steps to explain an embodiment 2 of the present invention. The same reference numerals in FIGS. 2A to 2J denote the same parts as in FIGS. 1A to 1J.

Figure 2A:
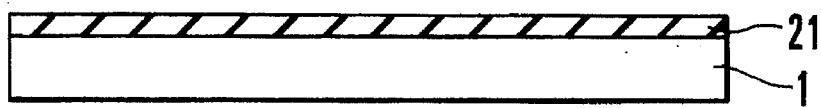
FIGS. 2A to 2J are views for explaining successive steps of another embodiment showing a method of forming an element isolation region of the present invention.

In the embodiment 2, as shown in FIG. 2A, a thin oxide film 21 having a thickness of 6 to 12 nm is formed on a silicon substrate 1 by annealing in a dry oxygen atmosphere at 900° C.

Figure 2B:
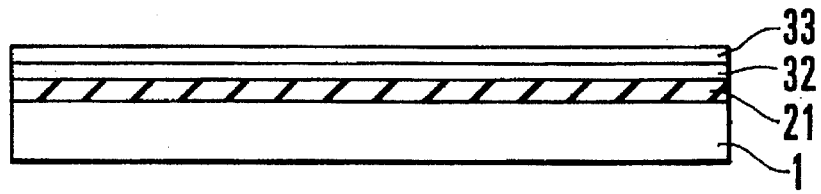

Subsequently, as shown in FIG. 2B, a silicon film 32 having a thickness of about 25 nm and consisting of undoped amorphous silicon is deposited, as shown in FIG. 2B. A silicon film 33 having a thickness of about 25 nm and doped with nitrogen is deposited on the silicon film 32. The doped state of the silicon film 33 is different from that of the silicon film 32.

The silicon film 32 is deposited at a temperature of about 500° C. by the CVD method using $SiH_4$ or $Si_2H_6$ as a source gas. The silicon film 33 is deposited at a temperature of about 500° C. by using an ammonia gas in addition to $SiH_4$ or $Si_2H_6$ after the deposition of the silicon film 32.

The concentration of nitrogen doped in the silicon film 33 is doped may fall within the range of $1 \times 10^{21}$ cm$^{-3}$ to $3 \times 10^{22}$ cm$^{-3}$. Note that since this silicon film 33 is doped with nitrogen, its oxidation rate is lower than that of the silicon film 32.

Figure 2C:
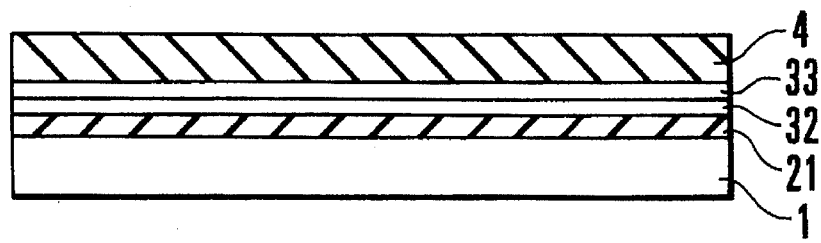

As shown in FIG. 2C, a silicon nitride ($Si_3N_4$) layer 4 having a thickness of about 200 nm and serving as a mask for field oxidation is formed.

Figure 2D:
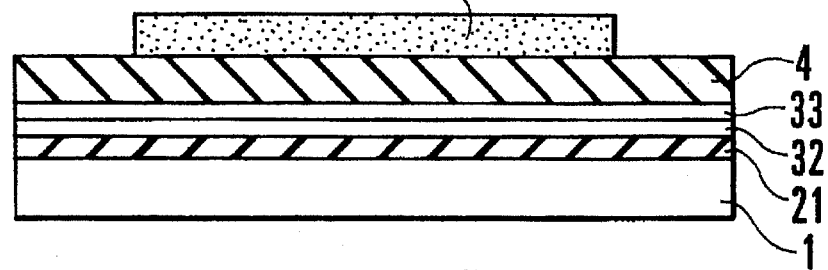

A photoresist layer is then formed on the silicon nitride layer 4, and a resist pattern 5 is formed by using a photolithographic technique, as shown in FIG. 2D.

Note that a resist photosensitive to X-rays or an electron beam resist may be used instead of the photoresist layer, and the resist pattern 5 may be formed by a lithographic technique using an X-ray or electron beam.

Figure 2E:
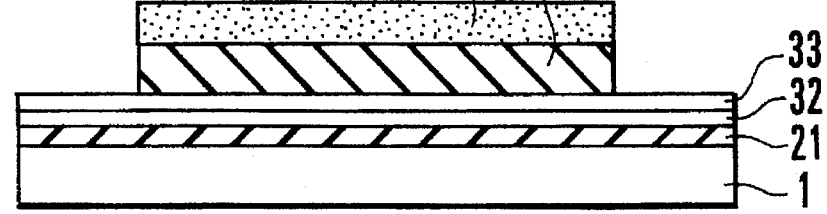

As shown in FIG. 2E, the silicon nitride layer 4 is etched by using the resist pattern 5 as a mask to form a silicon nitride mask 4a. This etching is performed by the RIE method using a carbon fluoride gas. The silicon layer 33 other than the portion under the silicon nitride mask 4a is exposed by this etching.

Figure 2F:
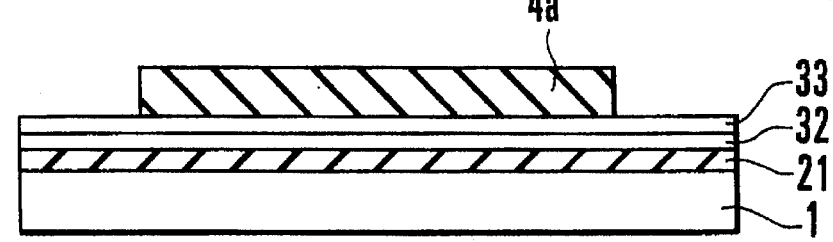

As shown in FIG. 2F, the resist pattern 5 is removed by an ashing process using oxygen radicals. Thereafter, the resultant structure undergoes RCA cleaning.

Figure 2G:
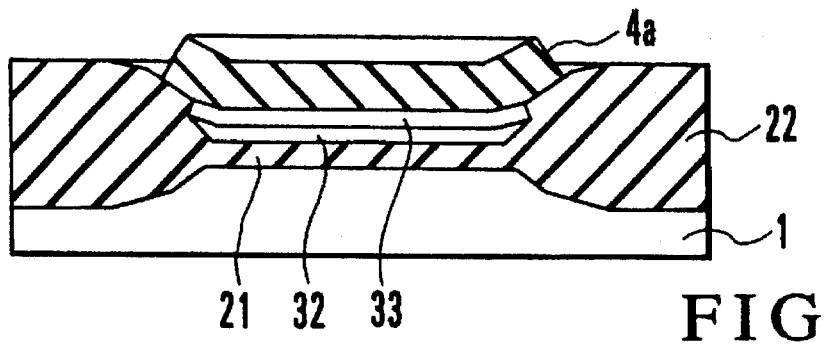
Figure 2H:
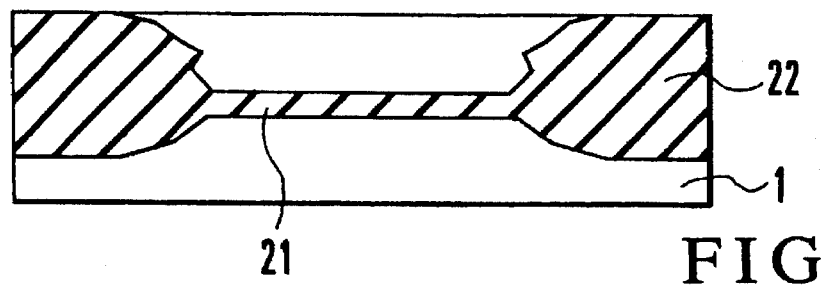

Subsequently, as shown in FIG. 2G, thermal oxidation is performed by using the silicon nitride mask 4a as a mask in an oxygen atmosphere containing water vapor at a temperature of 1,000° C., thereby selectively oxidizing the exposed silicon films 32 and 33 and the surface of the silicon substrate 1. As a result, a thick oxide film 22a having a thickness of 450 nm is formed. An oxidation temperature of 1,000° C. is an example and may be changed within the range of, e.g., 700° to 1,150° C. without posing any problem.

A thin oxide film formed on the surface of the silicon nitride mask 4a by this thermal oxidation is removed by using dilute hydrofluoric acid, and the silicon nitride mask 4a is selectively removed by using hot phosphoric acid.

Furthermore, the silicon films 32 and 33 are selectively etched (the step shown in FIG. 2H) by the RIE method using a chlorine-based gas to obtain an element isolation region is covered with the thick oxide film 22.

Figure 2I:
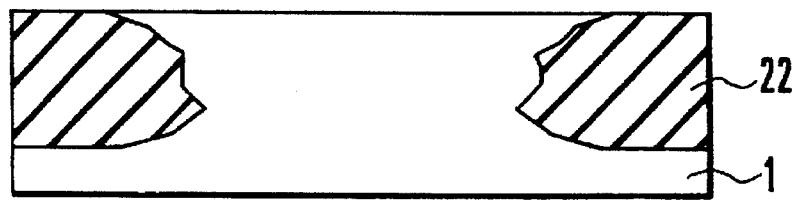

Finally, as shown in FIG. 2I, the thin oxide film 21 is removed to expose the surface of the silicon substrate 1 in the region surrounded by the thick oxide film 22.

Figure 2J:
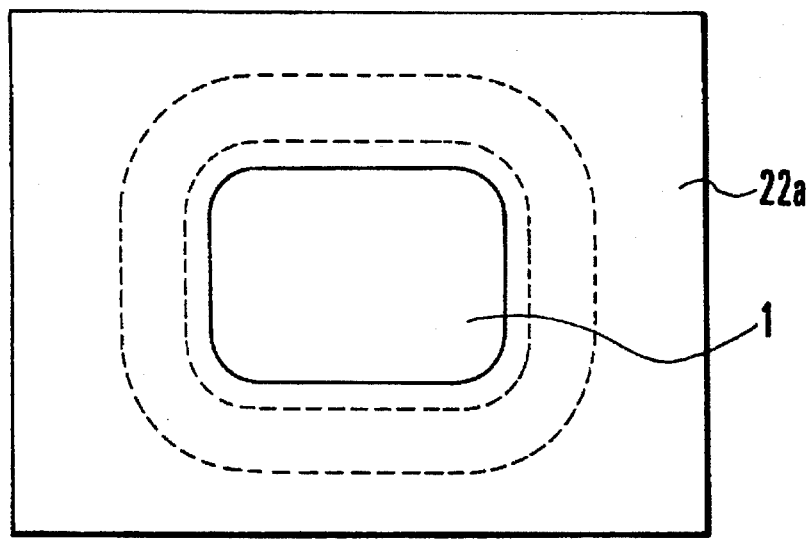

With the above method, no void is formed in the silicon layer constituted by the silicon films 32 and 33, and no hole is formed in the silicon substrate 1, as shown in FIG. 2J, unlike the conventional methods. In addition, the boundary portion of the thick oxide film 22a is free from an uneven state to form a smooth surface.

Since the silicon films 32 and 33 having different oxidation rates are used, unlike the embodiment 1, the cross-sectional shape of the thick oxide film 22a serving as a field oxide film is in a controlled state.

If nitrogen is doped in the single silicon layer used in the embodiment 1 such that the nitrogen concentration gradually increases toward the upper surface, the same effect as that of the embodiment 2 can be obtained.

[Embodiment 3]

In the embodiment shown in FIGS. 2A to 2J, although the undoped amorphous silicon film is used as the silicon film 32, the present invention is not limited to this film material. As this silicon film 32, an amorphous film doped with oxygen, which increases the oxidation rate, may be used to set the silicon film 32 in a doped state different from that of the silicon film 33.

By using the oxygen-doped amorphous silicon, the growth of polycrystalline grains of the silicon film 32 can be suppressed when the thick oxide film 22 is formed as a field oxide film. Since the silicon film 32 is doped with oxygen, its oxidation rate is increased. As a result, the difference in oxidation rate between the silicon film 32 and the silicon film 33 doped with nitrogen becomes larger than that in the embodiment 2.

For this reason, the inclination of the cross-sectional shape of a thick oxide film 22a can be further reduced while formation of an uneven boundary portion of the oxide film 22a is suppressed.

In the embodiments 1 and 2, the amorphous silicon is used as the silicon layer 32. However, the same effect as that described above can also be obtained by using microcrystalline polysilicon.

With a low-pressure CVD method, amorphous silicon can be deposited on a silicon oxide film at a deposition temperature of about 500° C.

In this case, microcrystalline polysilicon doped with nitrogen can be deposited by setting a deposition temperature of 650° C., introducing an ammonia gas as in addition to $SiH_4$ or $Si_2H_6$, and using nitrogen as an impurity.

In the embodiments 1 and 2, the silicon layer is doped with one impurity. In addition, in the embodiments 1 and 2 described above, one impurity is doped in each silicon layer to be used. However, the present invention is not limited to such a doping structure. One silicon layer may be doped with two or more impurities. If, for example, an amorphous silicon layer doped with oxygen and nitrogen is used as a silicon layer, the oxidation rate is slightly increased, and the growth of crystal grains can be suppressed more effectively.

In this case, if a silicon layer is doped with only oxygen, the growth of crystal grains is not so suppressed without greatly increasing the oxidation rate. On the other hand, if the doping amount of oxygen is increased to suppress the growth of crystal grains more effectively, the oxidation rate will excessively increase.

If, however, a silicon layer is doped with not only oxygen but also nitrogen or carbon, as described above, an excessive oxidation rate can be prevented. That is, by doping a silicon layer with one impurity which increases the oxidation rate and another impurity which decreases the oxidation rate, oxidation starting from an end portion of the silicon layer in selective oxidation can be controlled with a high precision, and hence the cross-sectional shape of a field oxide film can be controlled more finely.

[Embodiment 4]

In the above embodiments 2 and 3, as a method of shortening the oxidation time and controlling the cross-sectional shape of a field oxide film, there is provided a method of removing an upper layer portion of a silicon layer in a region to be electively oxidized before selective oxidation, i.e., a portion doped with an impurity which slows oxidation. According to this method, since a silicon layer to be subjected to field oxidation contains no impurity which decreases the oxidation rate, oxidation progresses quicker than in the above embodiments 2 and 3. On the other hand, a layer doped with an impurity which decreases oxidation and interferes with re-crystallization is left under a silicon nitride mask. This prevents formation of an uneven end portions of a bird's beak and voids in the silicon layer under the silicon nitride mask, as in the above embodiments 2 and 3.

FIGS. 3A to 3K show manufacturing steps to explain an embodiment 4 of the present invention. The same reference numerals in the embodiment 4 denote the same parts as in the above embodiments.

Figure 3A:
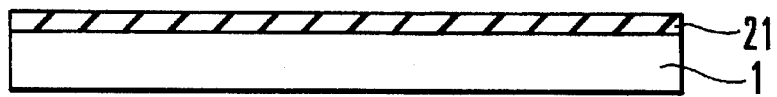
FIGS. 3A to 3K are views for explaining successive steps of still another embodiment showing a method of forming an element isolation region of the present invention.

First of all, as shown in FIG. 3A, a thin oxide film 21 having a thickness of 6 to 12 nm is formed on a silicon substrate 1 by annealing in a dry oxygen atmosphere at 900° C.

Figure 3B:
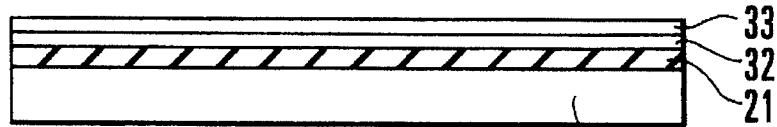

Subsequently, as shown in FIG. 3B, a silicon film 32 having a thickness of about 25 nm and consisting of undoped amorphous silicon or amorphous silicon doped with oxygen is deposited. A silicon film 33 having a thickness of about 25 nm and doped with nitrogen is deposited on the silicon film 32. The doped state of the silicon film 33 is different from that of the silicon film 32.

The silicon film 32 is deposited at a temperature of about 500° C. by the CVD method using $SiH_4$ or $Si_2H_6$ as a source gas or oxygen in addition to $SH_4$ and $Si_2H_6$. The silicon film 33 is deposited at a temperature of about 500° C. by using an ammonia gas in addition to $SiH_4$ or $Si_2H_6$ after the deposition of the silicon film 32.

The concentration of nitrogen doped in the silicon film 33 may fall within the range of $1 \times 10^{21}$ cm$^{-3}$ to $3 \times 10^{22}$ cm$^{-3}$. Note that since this silicon film 33 is doped with nitrogen, its oxidation rate is lower than that of the silicon film 32.

Figure 3C:
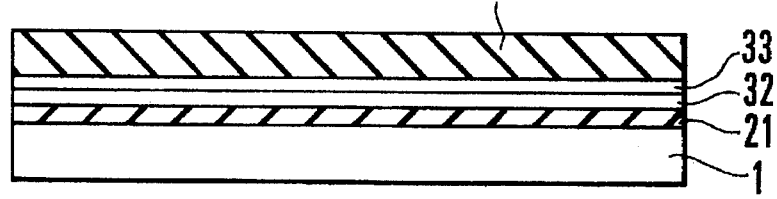
Figure 3D:
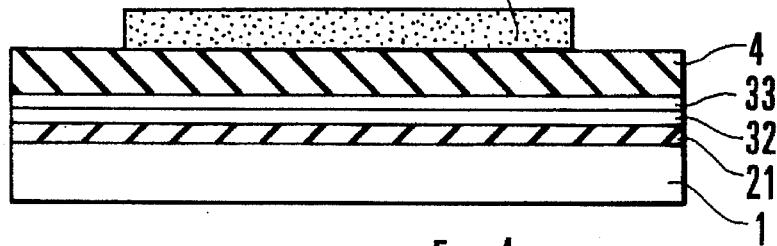

As shown in FIG. 3C, a silicon nitride ($Si_3N_4$) layer 4 having a thickness of about 200 nm and serving as a mask for field oxidation is formed. As shown in FIG. 3D, a photoresist layer is then formed on the silicon nitride layer 4, and a resist pattern 5 is formed by using a photolithographic technique.

Note that a resist photosensitive to X-rays or an electron beam resist may be formed instead of the photoresist layer, and the resist pattern 5 may be used by a lithographic technique using an X-ray or electron beam.

Figure 3E:
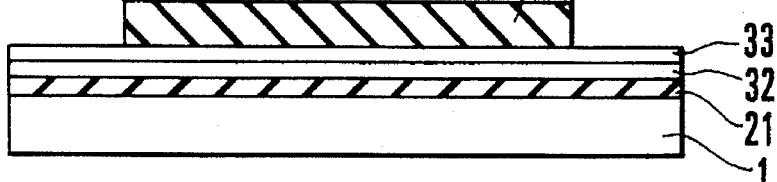

As shown in FIG. 3E, the silicon nitride layer 4 is etched by using the resist pattern 5 as a mask to form a silicon nitride mask 4a. This etching is performed by the RIE method using a carbon fluoride gas.

The silicon layer 33 other than the portion under the silicon nitride mask 4a is exposed by this etching.

Figure 3F:
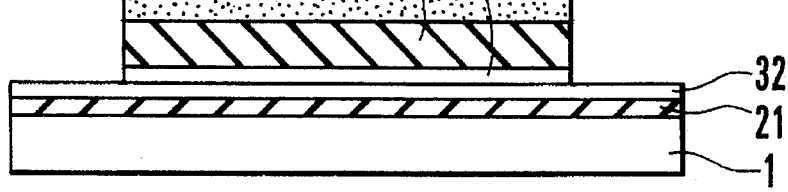
Figure 3G:
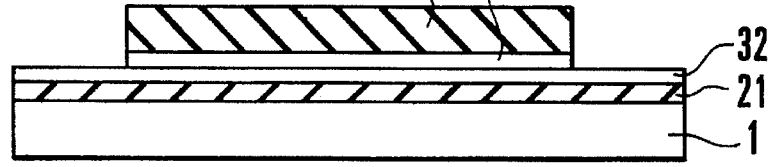

As shown in FIG. 3F, the silicon film 33 is etched by the RIE method using a chlorine-based gas and the resist pattern 5 as a mask. At this time, the silicon film 32 located under the silicon film 33t is not etched. As shown in FIG. 3G, the resist pattern 5 is then removed by an ashing process using oxygen radicals. Thereafter, the resultant structure undergoes RCA cleaning.

Figure 3H:
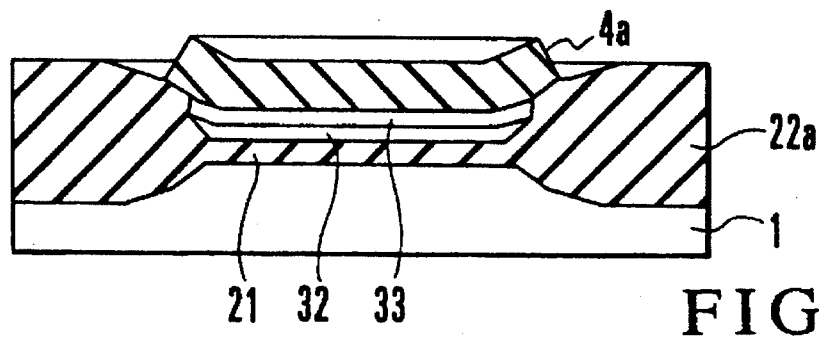
Figure 3I:
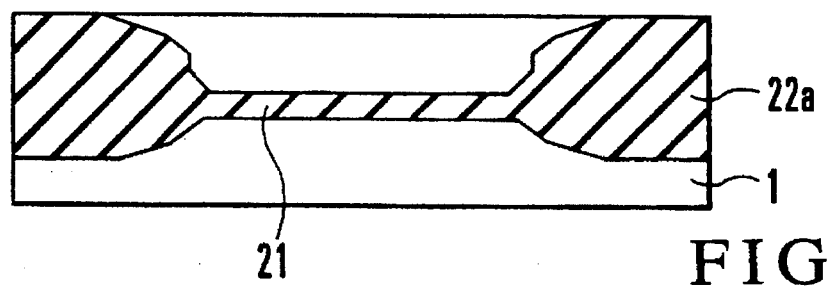

Subsequently, as shown in FIG. 3H, thermal oxidation is performed by using the silicon nitride mask 4a as a mask in an oxygen atmosphere containing water vapor at a temperature of 1,000° C., thereby selectively oxidizing the exposed silicon film 32 and a film edge of the film 33 and the surface of the silicon substrate 1. As a result, a thick oxide film 22 having a thickness of 450 nm is formed. An oxidation temperature of 1,000° C. is an example and may be changed within the range of, e.g., 700° to 1,150° C. without posing any problem.

A thin oxide film formed on the surface of the silicon nitride mask 4a by this thermal oxidation is removed by using dilute hydrofluoric acid, and the silicon nitride mask 4a is selectively removed by using hot phosphoric acid. Furthermore, the silicon films 32 and 33 are selectively etched (FIG. 3I) by the RIE method using a chlorine-based gas to obtain an element isolation region covered with the thick oxide film 22.

Figure 3J:
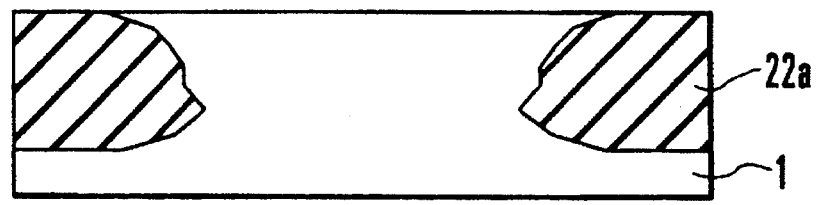

Finally, as shown in FIG. 3J, the thin oxide film 21 is removed to expose the surface of the silicon substrate 1.

Figure 3K:
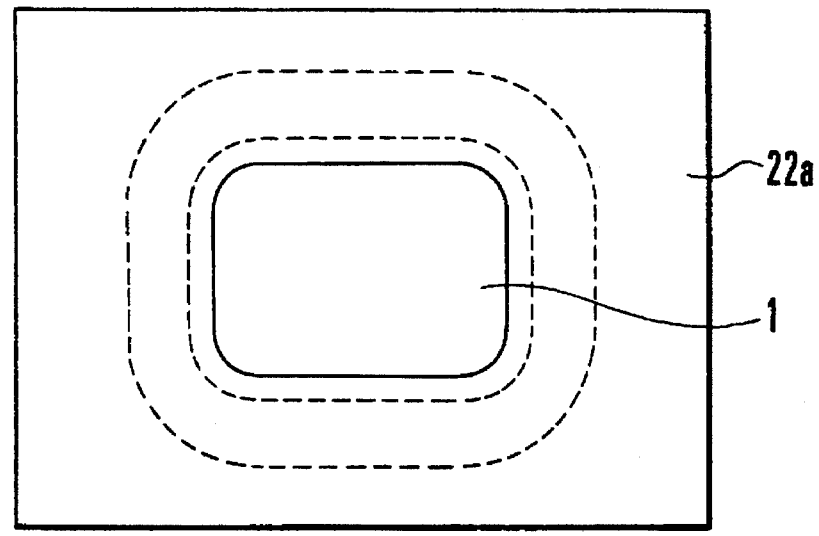

With the above method, no void is formed in the silicon layer constituted by the silicon films 32 and 33, and hence no hole is formed in the silicon substrate 1, as shown in FIG. 3K, unlike the conventional methods. In addition, the boundary portion of the thick oxide film 22 is free from an uneven state.

Since the silicon films 32 and 33 having different oxidation rates are used, unlike the embodiment 1, the cross-sectional shape of the thick oxide film 22 serving as a field oxide film is in a controlled state.

Note that in the above embodiment 1, the same effect as that of the embodiment 2 can be obtained even by forming a single silicon layer such that nitrogen doped in the layer gradually increases in concentration toward the upper surface, and etching the heavily doped region.

In the above embodiment 1, the silicon layer 31 is thermally oxidized without being processed (e.g., FIGS. 1F to 1G). However, the present invention is not limited to this.

As in the following embodiment, after a nitride film serving as a mask for oxidation is etched by using a resist pattern as a mask formed to surround an element isolation region, a silicon layer may be selectively removed.

In this selective removing process, the entire silicon layer other than the portion under the silicon nitride mask may be removed. Alternatively, the silicon layer may be left to some thickness, i.e., the silicon layer other than the portion under the silicon nitride mask may be thinned. With this process, when an element isolation region is formed by thermal oxidation, the difference in level between the surface of the oxide film in the element isolation region and the surface of the silicon layer in the active region can be reduced. This will improve the precision and the yield in pattern formation in the step of forming a gate electrode wiring layer.

[Embodiment 5]

FIGS. 4A to 4K show manufacturing steps to explain the embodiment 5 of the present invention. The same reference numerals in the embodiment 5 denote the same parts as in the above embodiments.

Figure 4A:
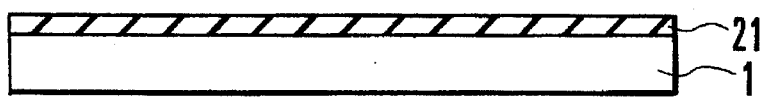
FIGS. 4A to 4K are views for explaining successive steps of still another embodiment showing a method of forming an element isolation region of the present invention.

Firstly, as shown in FIG. 4A, a thin oxide film 21 having a thickness of 6 to 12 nm is formed on a silicon substrate 1 by annealing in a dry oxygen atmosphere at 900° C.

By forming the oxide film 21, the stress acting on the silicon substrate 1 based on the subsequent steps is reduced. The oxide film 21 is also served as an etching stopper in removing a silicon layer formed thereon.

Figure 4B:
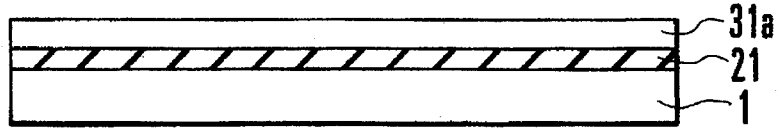

Subsequently, as shown in FIG. 4B, nitrogen-doped amorphous silicon is deposited by using the CVD method to form a silicon layer 31a having a thickness of about 50 nm on the thin oxide film 21.

In this deposition by the CVD method, the deposition temperature is set to be 500° C., and an ammonia gas is used in addition to $SiH_4$ or $Si_2H_6$. Nitrogen doping is performed simultaneous with the deposition of amorphous silicon.

This nitrogen is an impurity for preventing crystallization of silicon and decreasing the oxidation rate.

Nitrogen doped in the silicon layer may have a concentration in the range of $1\times10^{21}$ cm$^{-3}$ to $3\times10^{22}$ cm$^{-3}$.

If the doping amount of an impurity such as nitrogen, carbon, or oxygen is smaller than $1\times10^{21}$ cm$^{-3}$, the effect of suppressing the growth of crystal grains is not so enhanced.

In contrast to this, if the doping amount of each of these impurities exceeds $3\times10^{22}$ cm$^{-3}$, formation of a compound occurs rather than impurity doping.

For example, if the silicon layer is doped with such a large amount of nitrogen, the silicon layer becomes a nitride film.

The silicon layer (buffer layer) is partly oxidized in the step of forming a field oxide film. As a result, the stress in the substrate is reduced. In addition, since the silicon layer consists of amorphous silicon or microcrystalline polysilicon, the layer is not very hard and hence can reduce the stress.

If, however, this layer becomes a nitride film, no oxidation occurs. In addition, since the nitride film is very hard, the film cannot reduce the stress produced in the substrate. The same applies to carbon.

If the silicon layer is doped with an excessive amount of oxygen, the layer becomes an oxide film. As a result, a silicon oxide film is formed on an unnecessary portion.

Figure 4C:
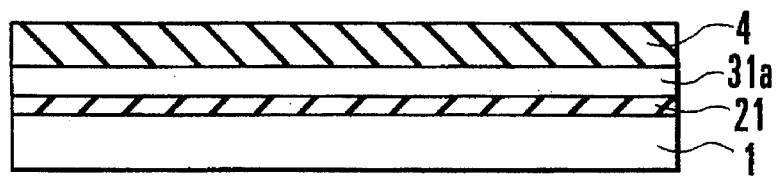

Subsequently, as shown in FIG. 4C, a silicon nitride layer ($Si_3N_4$) 4 having a thickness of about 200 nm and serving as a mask for field oxidation (selective oxidation) is formed.

Figure 4D:
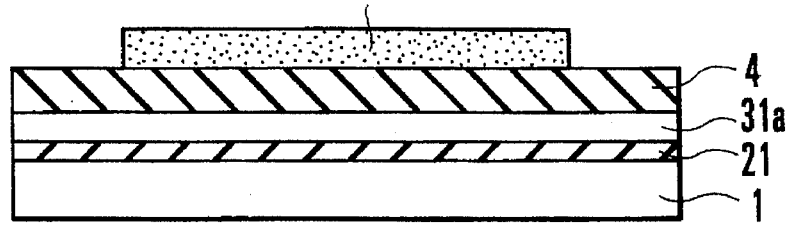

A photoresist layer is formed on the silicon nitride layer 4 and patterned to form a resist pattern 5, as shown in FIG. 4D.

Note that a resist photosensitive to X-rays or an electron beam resist may be formed instead of the photoresist layer, and the resist pattern 5 may be used by a lithographic technique using an X-ray or electron beam.

Figure 4E:
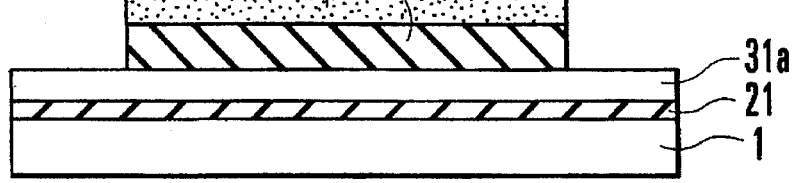

As shown in FIG. 4E, the silicon nitride layer 4 is etched by using the resist pattern 5 as a mask to form a silicon nitride mask 4a.

This etching is performed by the reactive ion etching (RIE) method using a carbon fluoride gas.

The silicon layer 31a other than the portion under the silicon nitride mask 4a is exposed by this etching.

Figure 4F:
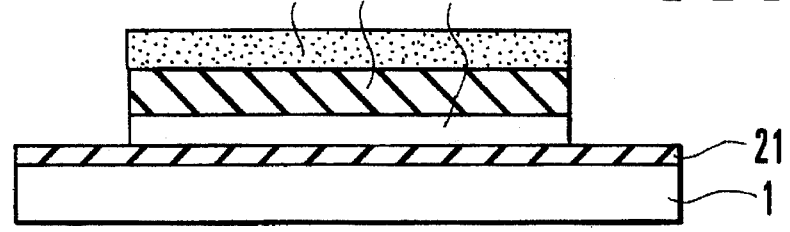

As shown in FIG. 4F, the exposed portion of the silicon layer 31a is etched by the RIE method using a chlorine-based gas and the resist pattern 5 as a mask.

Figure 4G:
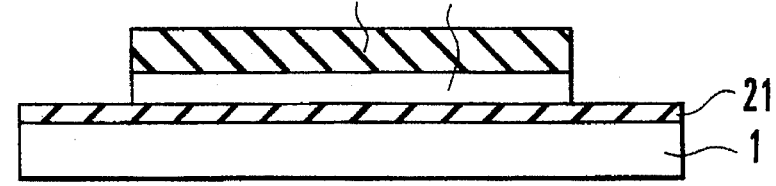

As shown in FIG. 4G, the resist pattern 5 is then removed by an ashing process using oxygen radicals.

The exposed thin oxide film 21 on the silicon substrate 1 is removed by an etching technique using dilute hydrofluoric acid to expose the surface of the silicon substrate 1 other than the portion under the silicon nitride mask 4a.

The silicon substrate 1 then undergoes RCA cleaning based on a liquid treatment using a liquid mixture of ammonia and hydrogen peroxide and a liquid treatment using a liquid mixture of hydrochloric acid and hydrogen peroxide.

Figure 4H:
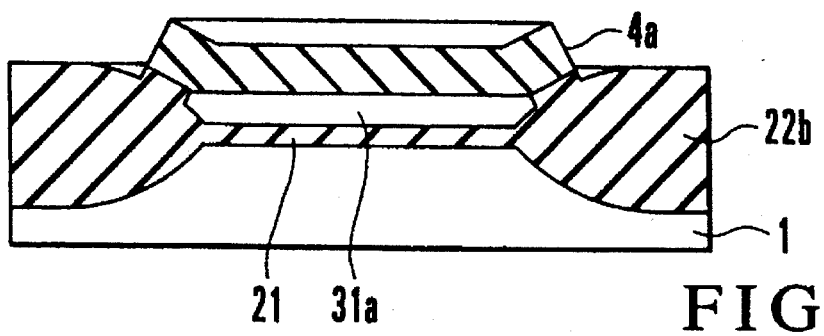

Subsequently, as shown in FIG. 4H, thermal oxidation is performed by using the silicon nitride mask 4a as a mask in an oxygen atmosphere containing water vapor at a temperature of 1,000° C., thereby oxidizing the exposed side surface of the silicon layer 31a and the surface of the silicon substrate 1. As a result, a thick oxide film 22 having a thickness of 450 nm is formed.

A thin oxide film formed on the surface of the silicon nitride mask 4a is etched by using dilute hydrofluoric acid, and the silicon nitride mask 4a is selectively removed by using hot phosphoric acid.

Figure 4I:
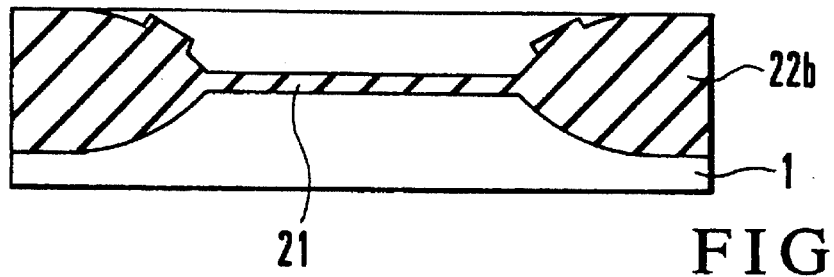

Furthermore, the silicon layer 31a is selectively removed by the RIE method using a chlorine-based gas to obtain the silicon substrate 1 on which an element isolation region covered with the thick oxide film 22 is formed, as shown in FIG. 4I.

Figure 4J:
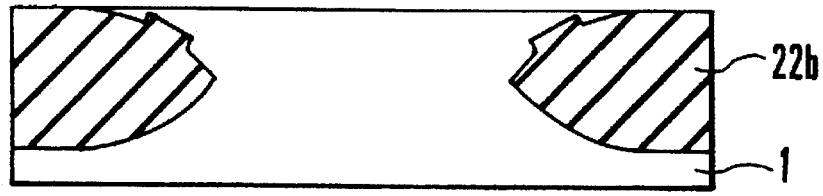

Finally, as shown in FIG. 4J, the thin oxide film 21 is removed to expose the surface of the silicon substrate 1 in the region surrounded by the thick oxide film 22.

Figure 4K:
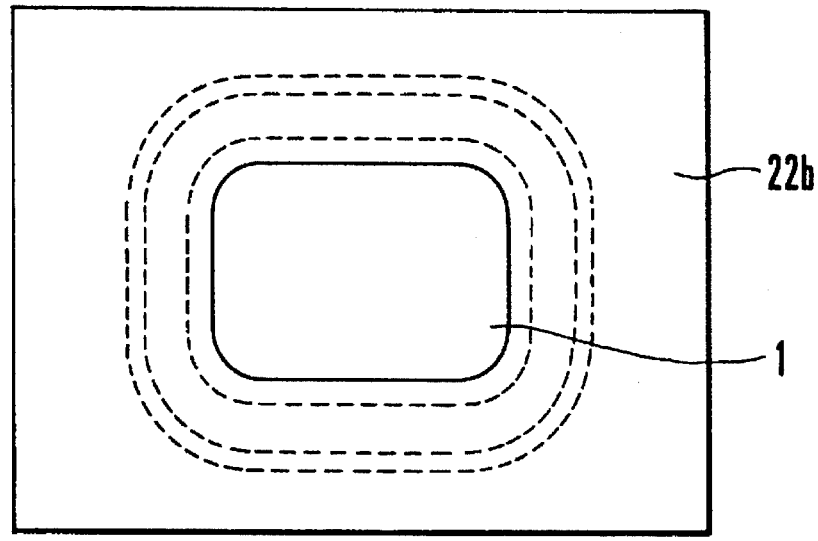

With the above method, no void is formed in the silicon layer 31a, and hence no hole is formed in the silicon substrate 1, as shown in FIG. 4K, unlike the conventional methods. In addition, the boundary portion of the oxide film 22 is free from an uneven state.

Since the silicon layer 31a is doped with an impurity at the time of the formation of the silicon layer 31a, the problems can be solved without increasing the number of manufacturing steps as compared with the conventional methods.

Furthermore, in this embodiment 5, since the silicon layer 31a is doped with nitrogen, the oxidation rate is reduced, and the bird's beak can be shortened.

[Embodiment 6]

FIGS. 5A to 5K show manufacturing steps to explain an embodiment 6 of the present invention. The same reference numerals in FIGS. 5A to 5K denote the same parts as in the above embodiments.

Figure 5A:
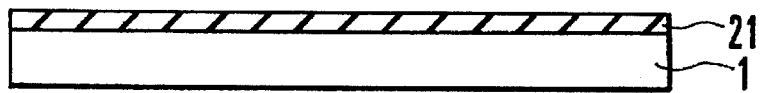
FIGS. 5A to 5K are views for explaining successive steps of still another embodiment showing a method of forming an element isolation region of the present invention.

Firstly, as shown in FIG. 5A, a thin oxide film 21 having a thickness of 6 to 12 nm is formed on a silicon substrate 1 by annealing in a dry oxygen atmosphere at 900° C.

Figure 5B:
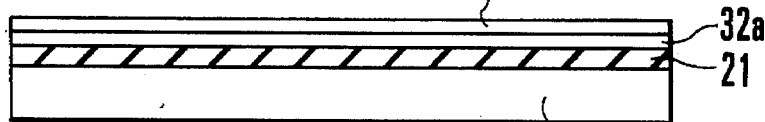

Subsequently, as shown in FIG. 5B, a silicon film 32a having a thickness of about 25 nm and consisting of undoped amorphous silicon is deposited, and a silicon film 33a having a thickness of about 25 nm and doped with nitrogen is deposited on the silicon film 32a.

The silicon film 32a is deposited by the CVD method using $SiH_4$ and $Si_2H_6$ at a temperature of about 500° C.

The silicon film 33a is also deposited by using an ammonia gas as a source gas in addition to $SiH_4$ or $Si_2H_6$ at a temperature of about 500° C. after the deposition of the silicon film 32a.

Nitrogen doped in the silicon layer 33a may have a concentration in the range of $1\times10^{21}$ $cm^{-3}$ to $3\times10^{22}$ $cm^{-3}$. Note that this silicon film 33a is doped with nitrogen, and hence its oxidation rate is lower than that of the silicon film 33a.

Figure 5C:
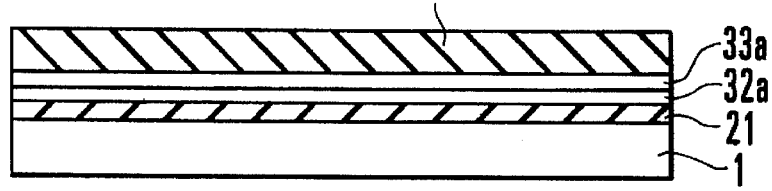

Subsequently, as shown in FIG. 5C, a silicon nitride layer ($Si_3N_4$) 4 having a thickness of about 200 nm and serving as a mask for field oxidation is formed.

Figure 5D:
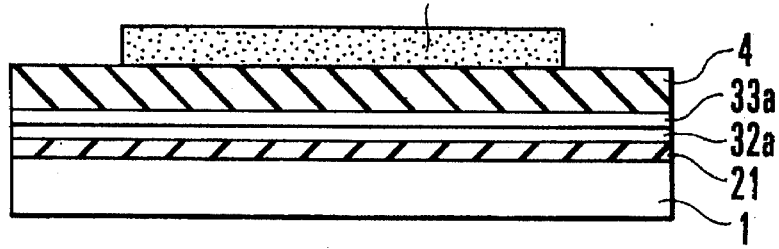

A photoresist layer is formed on the silicon nitride layer 4, and a resist pattern 5 is formed by a lithographic technique, as shown in FIG. 5D.

Note that a resist photosensitive to X-rays or an electron beam resist may be formed instead of the photoresist layer, and the resist pattern 5 may be formed by a lithographic technique using an X-ray or electron beam.

Figure 5E:
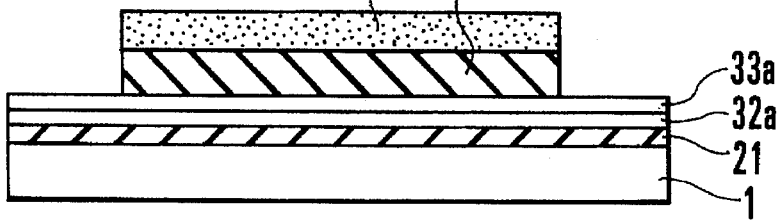

As shown in FIG. 5E, the silicon nitride layer 4 is etched by using the resist pattern 5 as a mask to form a silicon nitride mask 4a.

This etching is performed by the RIE method using a carbon fluoride gas.

The silicon layer 33a other than the portion under the silicon nitride mask 4a is exposed by this etching.

Figure 5F:
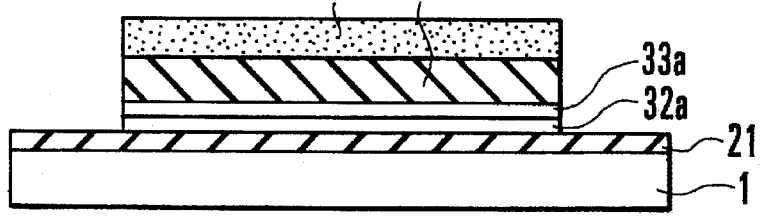

As shown in FIG. 5F, the silicon films 32a and 33a are selectively removed by the RIE method using a chlorine-based gas to expose the surface of the thin oxide film 21 other than the portion under the resist pattern 5.

Figure 5G:
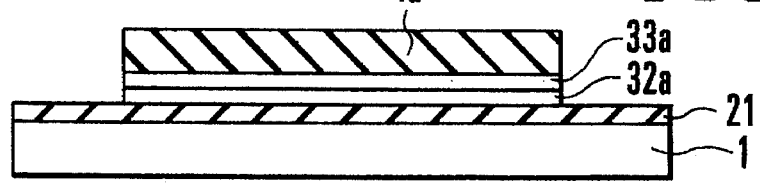

As shown in FIG. 5G, the resist pattern 5 is then removed by an ashing process using oxygen radicals.

The exposed thin oxide film 21 is removed by an etching technique using an etchant consisting of carbon fluoride. The silicon substrate 1 is then cleaned by RCA cleaning.

Figure 5H:
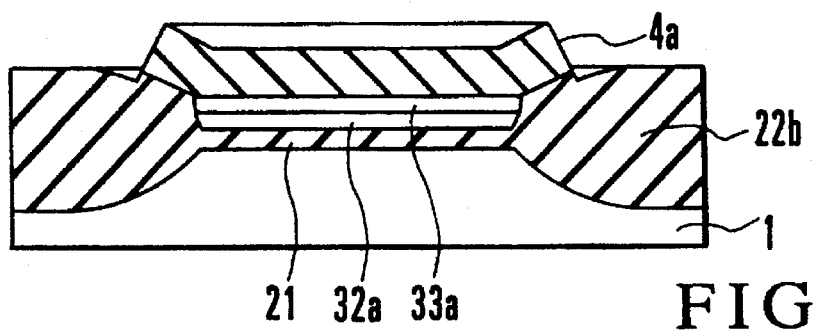
Figure 5I:
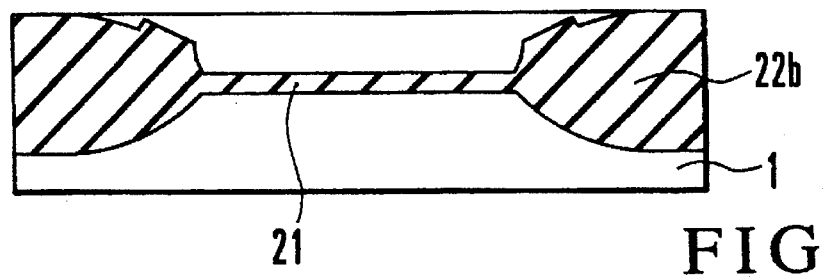

Subsequently, as shown in FIG. 5H, thermal oxidation is performed by using the silicon nitride mask 4a as a mask in an oxygen atmosphere containing water vapor at a temperature of 1,000° C., thereby oxidizing the exposed side surfaces of the silicon layers 32a and 33a and the surface of the silicon substrate 1. As a result, a thick oxide film 22a having a thickness of 450 nm is formed.

A thin oxide film formed on the surface of the silicon nitride mask 4a by this thermal oxidation is etched by using dilute hydrofluoric acid, and the silicon nitride mask 4a is selectively etched by using hot phosphoric acid.

Furthermore, the silicon layers 32a and 33a are selectively etched (FIG. 5I) by the RIE method using a chlorine-based gas to form an element isolation region covered with the thick oxide film 22a.

Figure 5J:
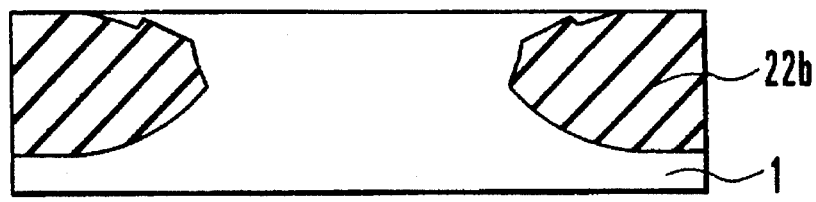

Finally, as shown in FIG. 5J, the thin oxide film 21 is removed to expose the surface of the silicon substrate 1.

Figure 5K:
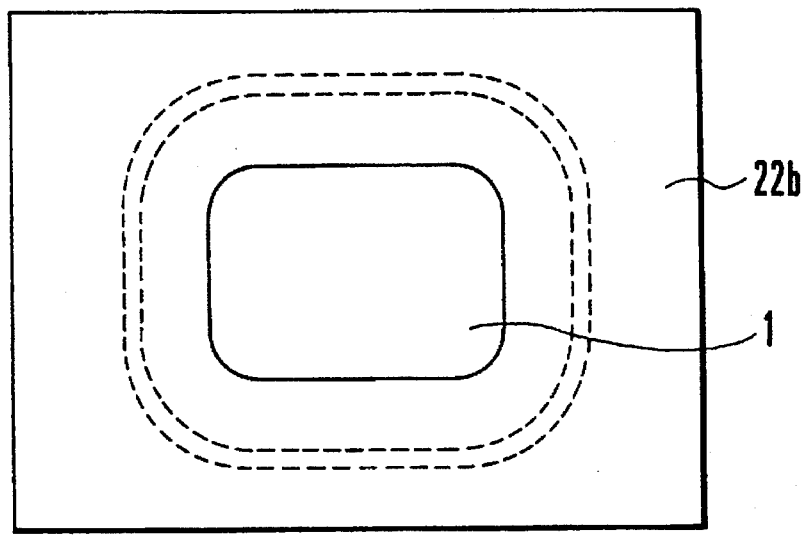
Figure 6A:
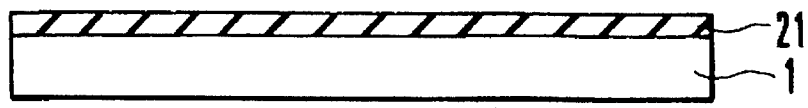
FIGS. 6A to 6K are views for explaining successive steps of a conventional poly-buffered LOCOS method.
Figure 6B:
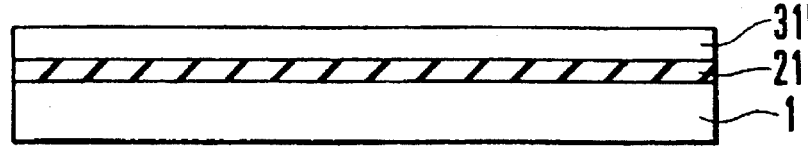
Figure 6C:
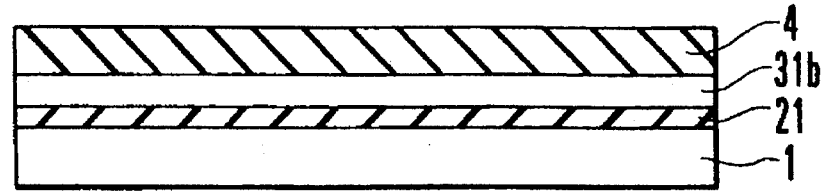
Figure 6D:
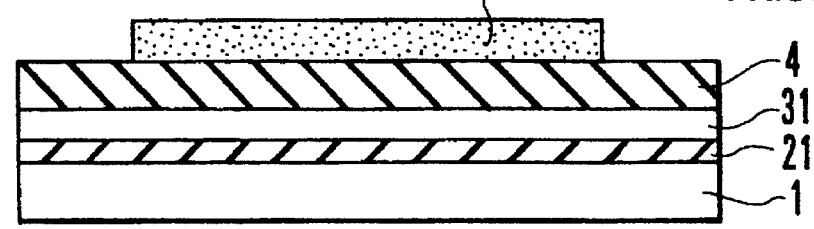
Figure 6E:
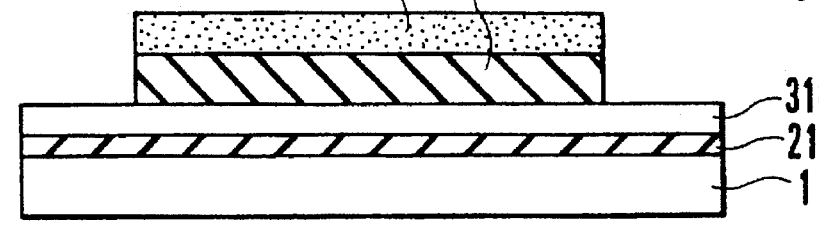
Figure 6F:
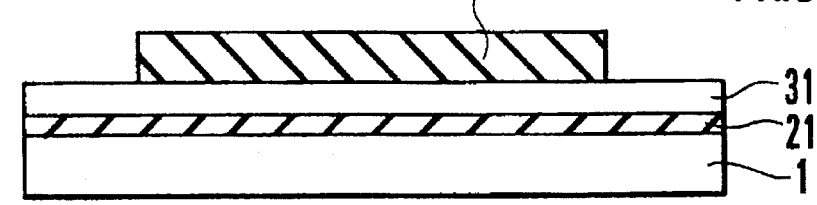
Figure 6G:
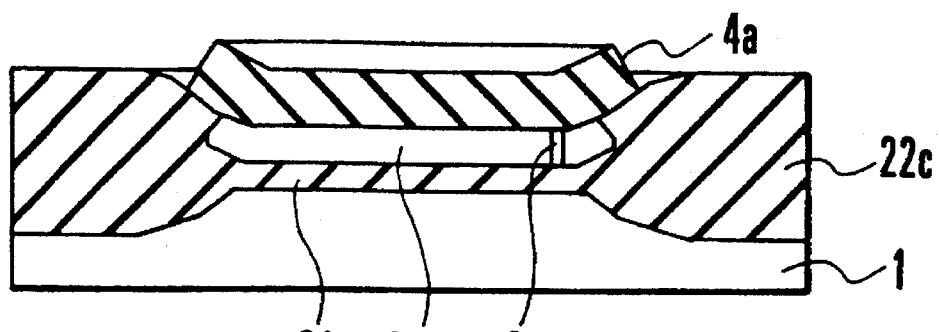
Figure 6H:
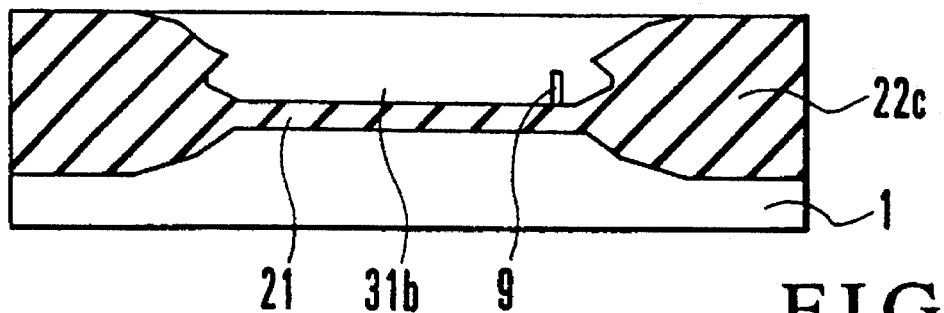
Figure 6I:
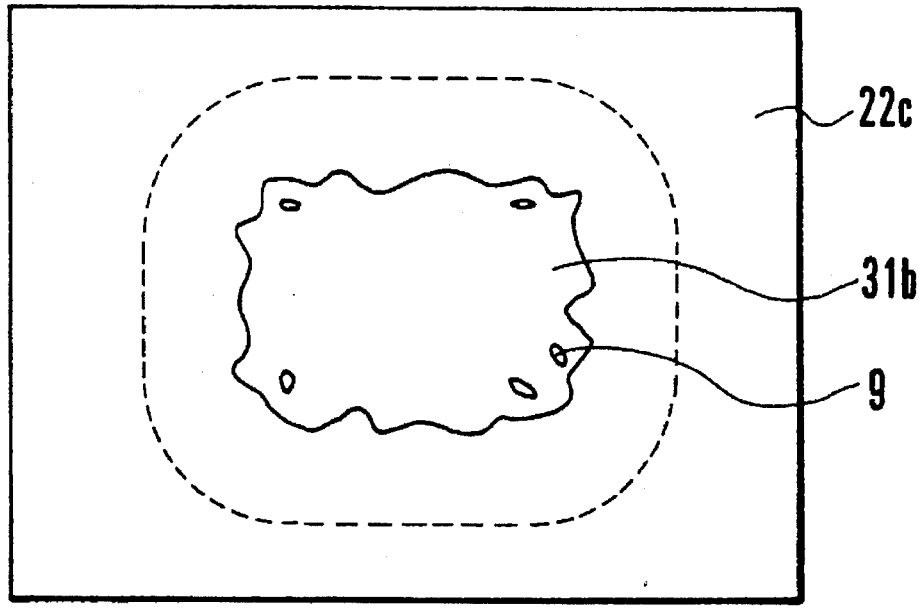
Figure 6J:
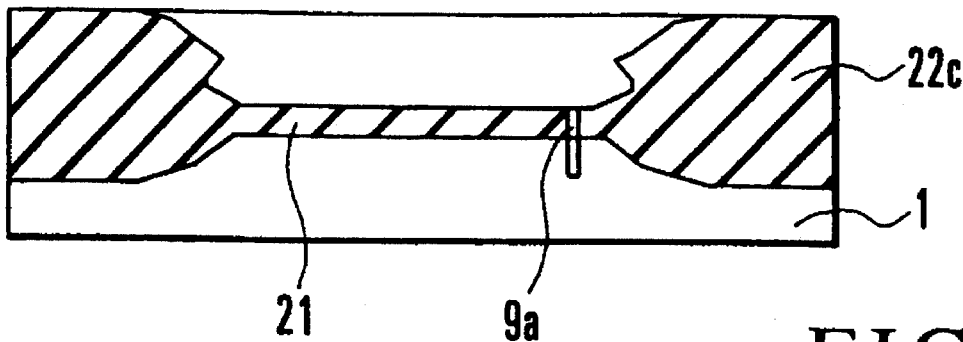
Figure 6K:
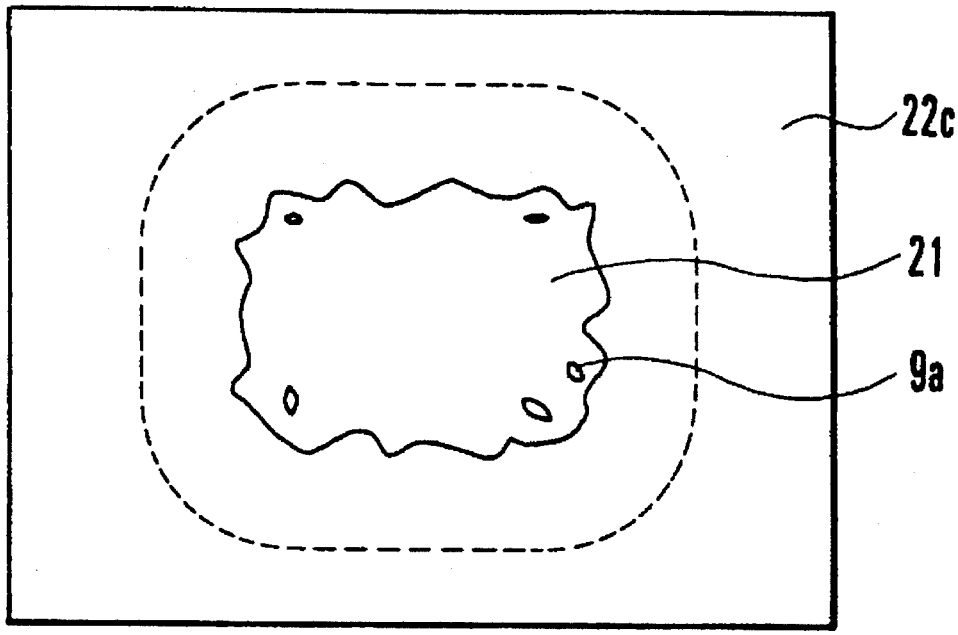
Figure 7A:
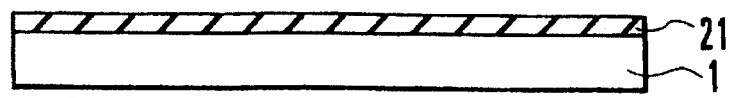
FIGS. 7A to 7L are views for explaining successive steps of another example of the conventional poly-buffered LOCOS method.
Figure 7B:
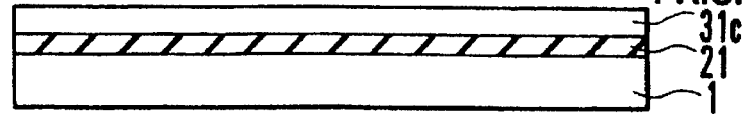
Figure 7C:
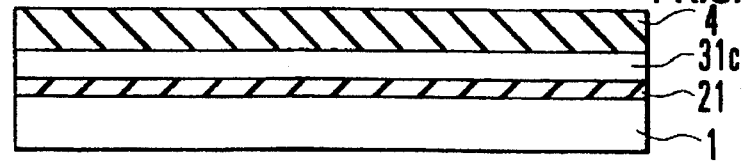
Figure 7D:
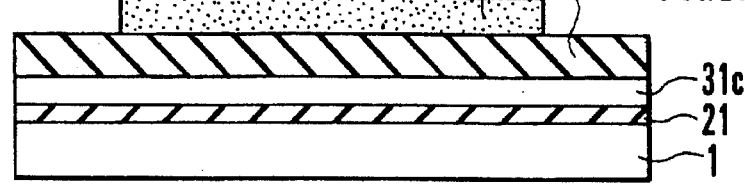
Figure 7E:
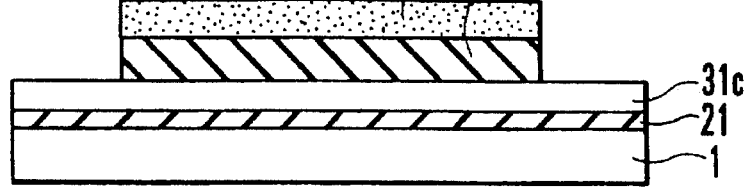
Figure 7F:
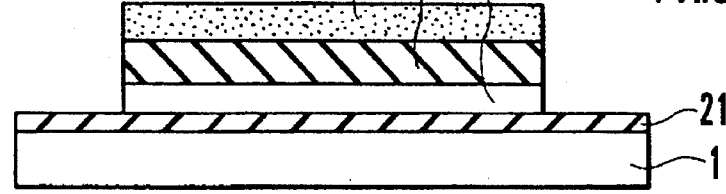
Figure 7G:
Figure 7H:
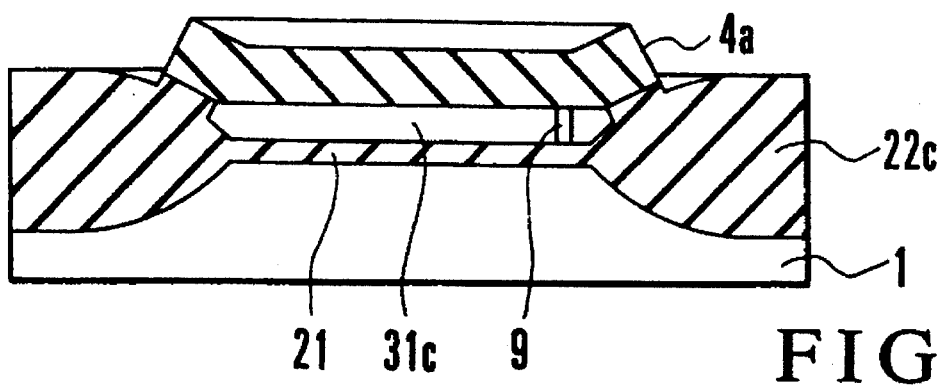
Figure 7I:
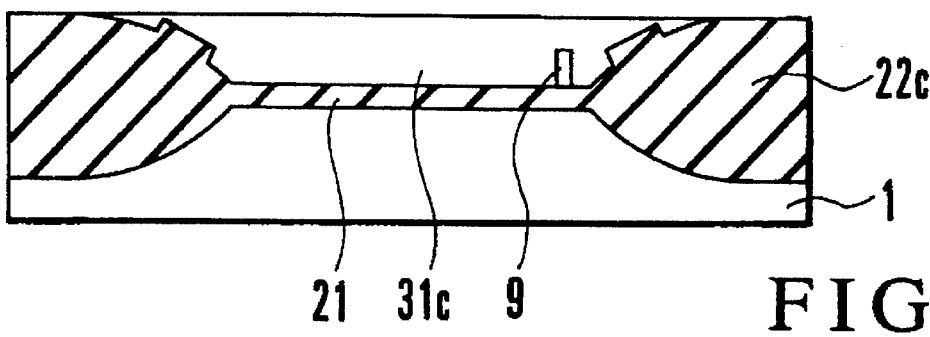
Figure 7J:
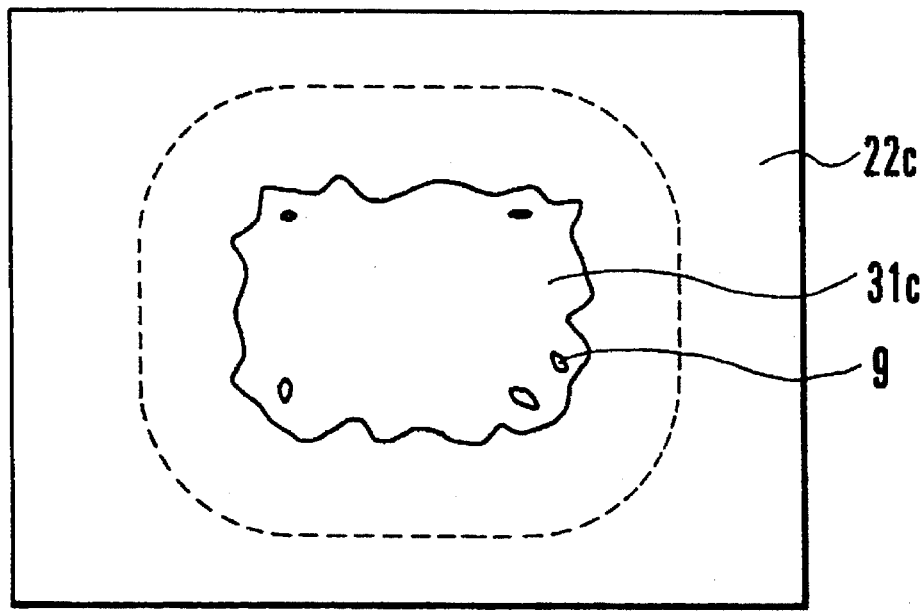
Figure 7K:
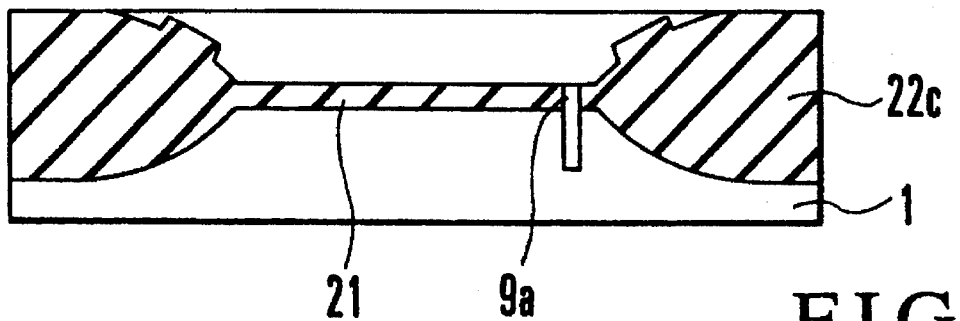
Figure 7L:
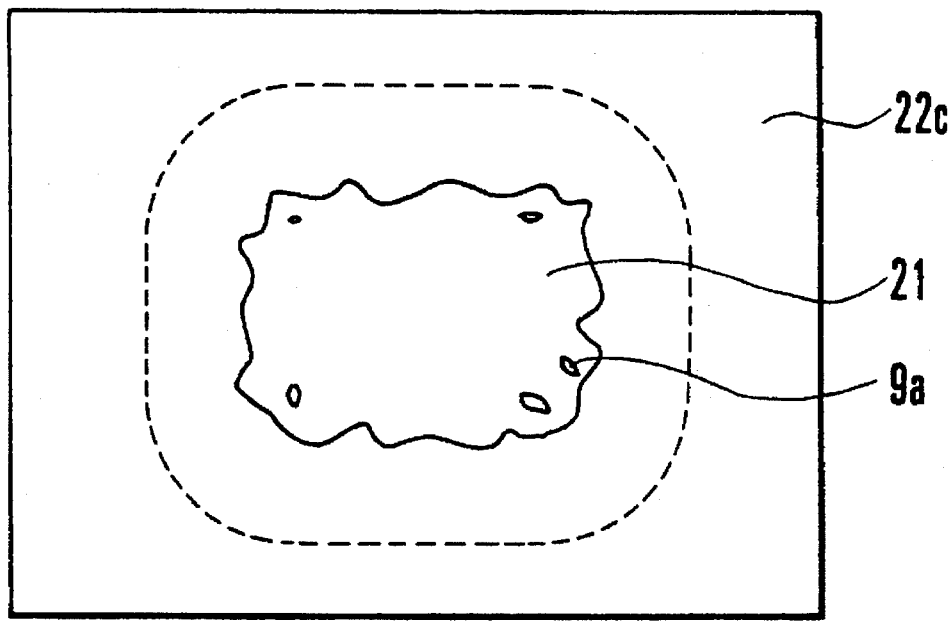
Figure 1G:
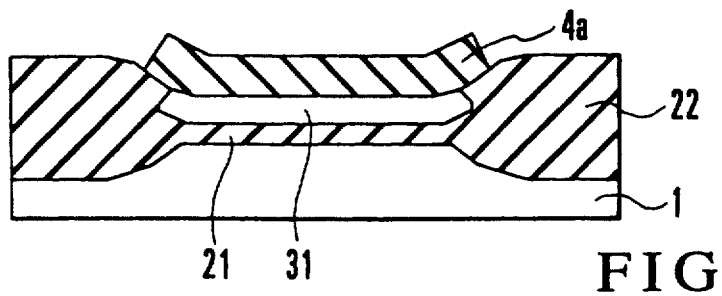
Figure 1H:
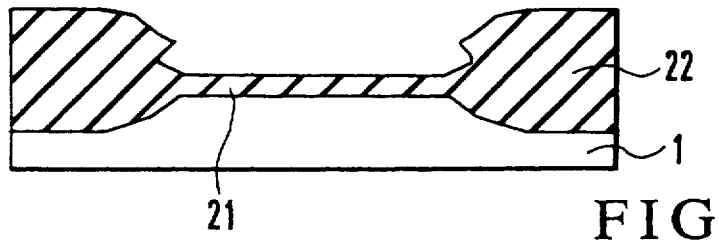
Figure 1I:
Figure 1J:
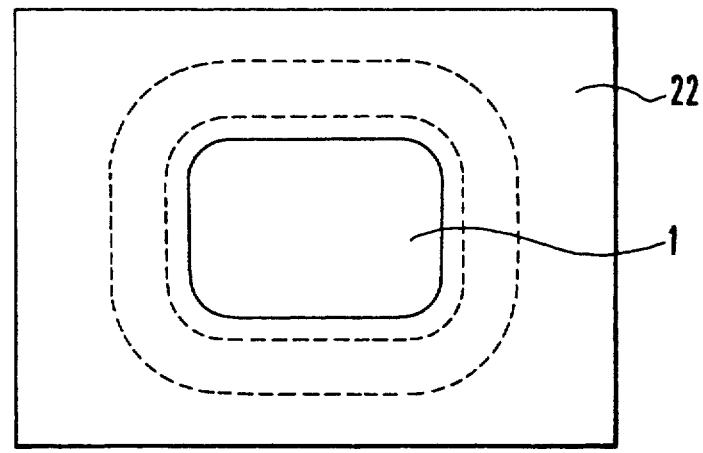
Figure 2G:
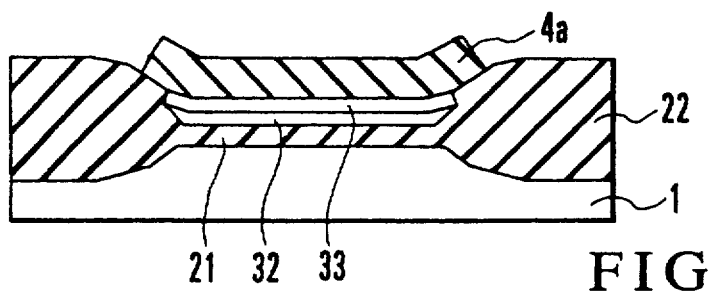
Figure 2H:
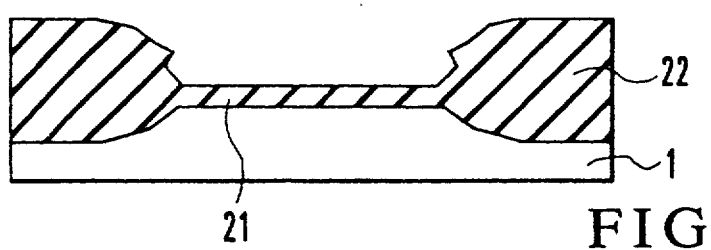
Figure 2I:
Figure 2J:
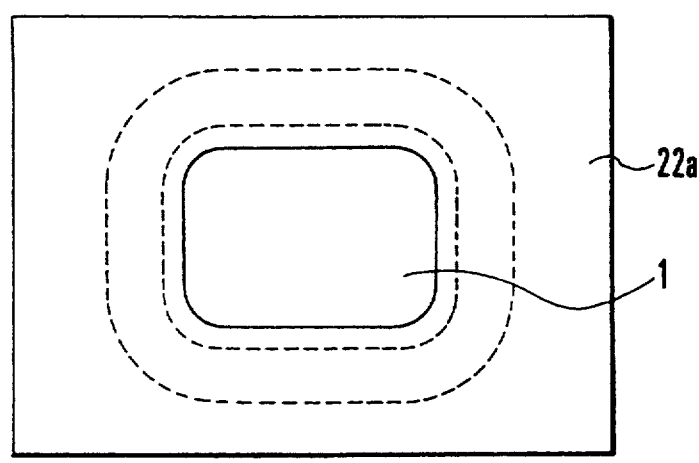
Figure 3H:
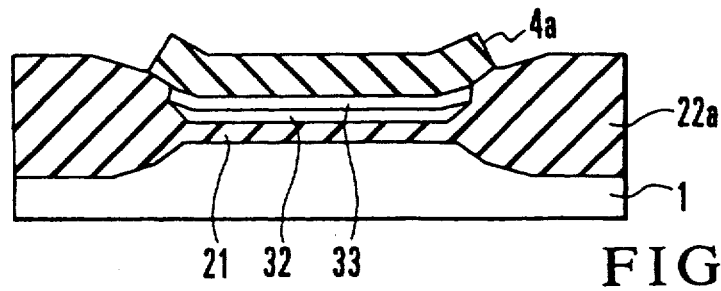
Figure 3I:
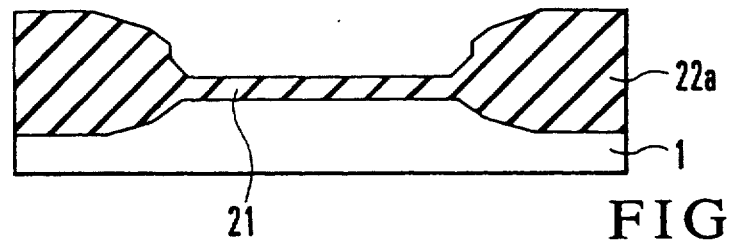
Figure 3J:
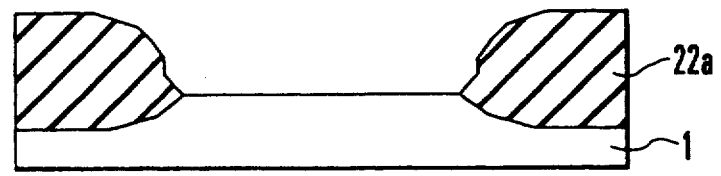
Figure 3K:
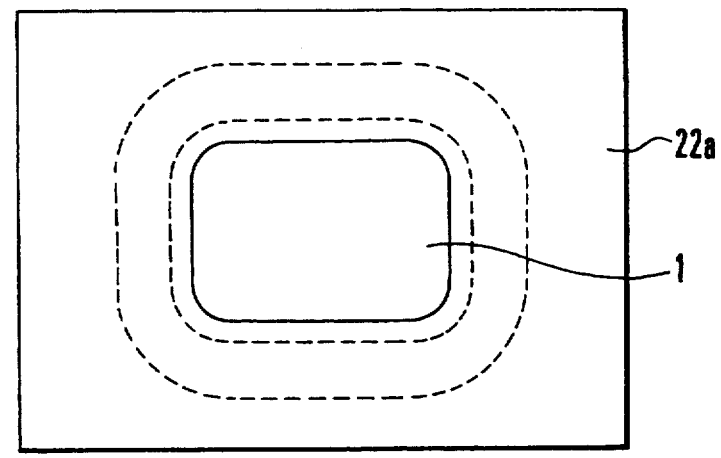
Figure 4H:
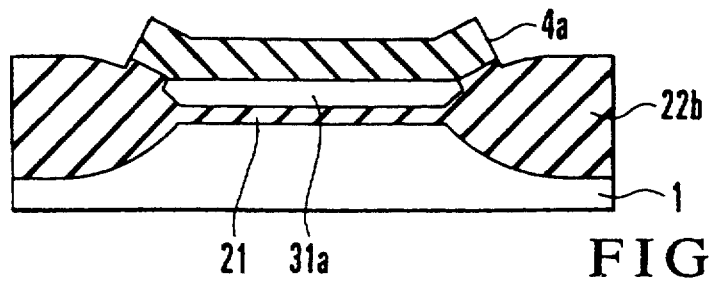
Figure 4I:
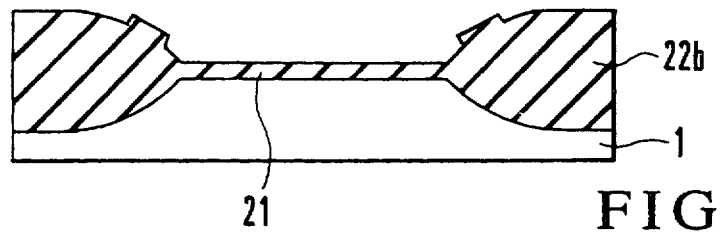
Figure 4J:
Figure 4K:
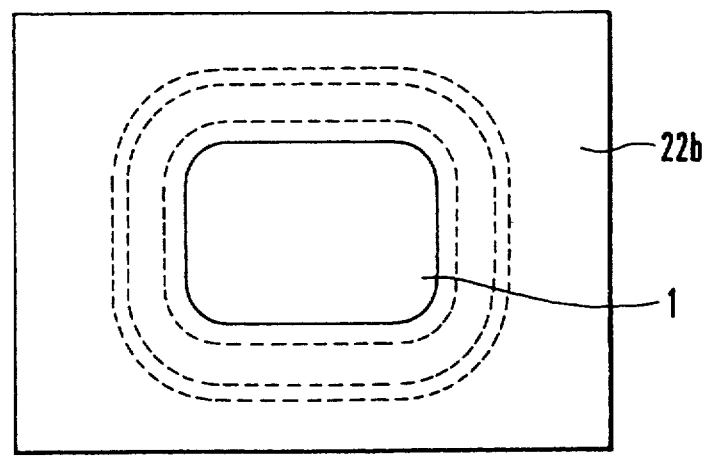
Figure 5H:
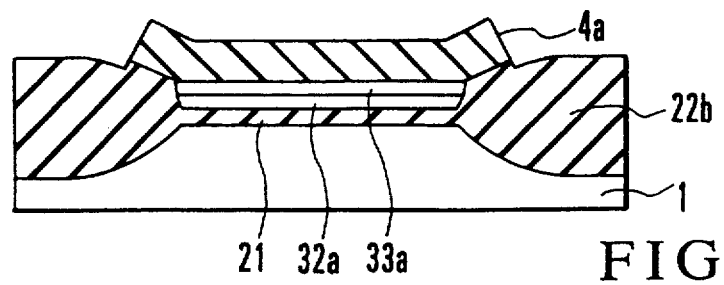
Figure 5I:
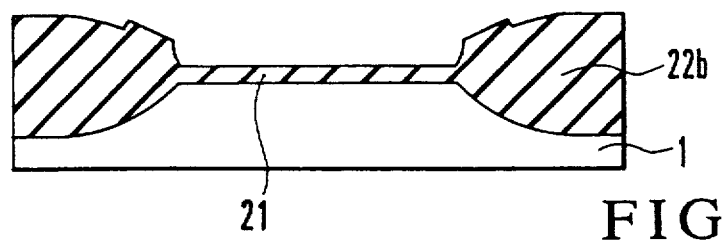
Figure 5J:
Figure 5K:
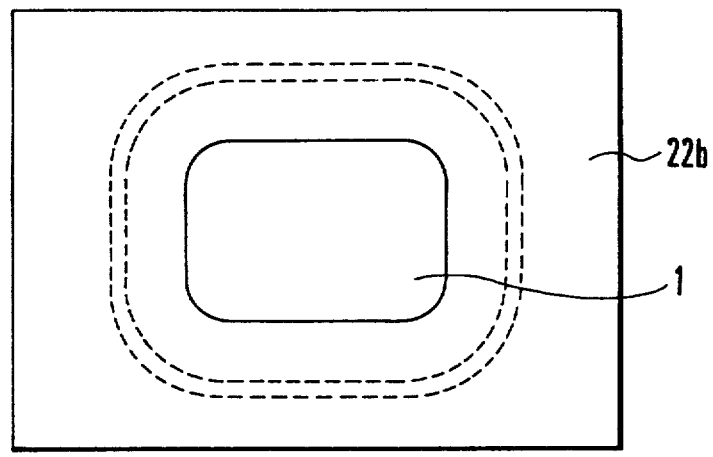
Figure 6G:
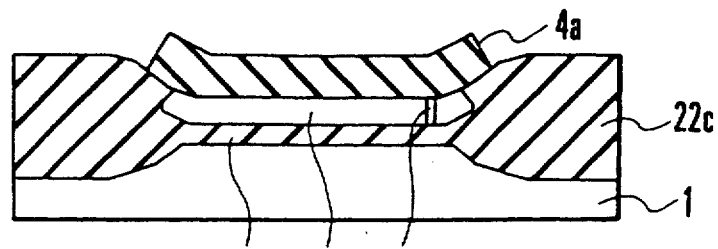
Figure 6H:
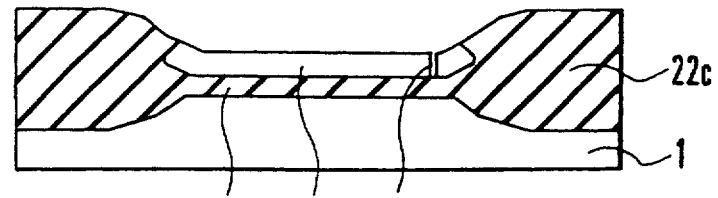
Figure 6I:
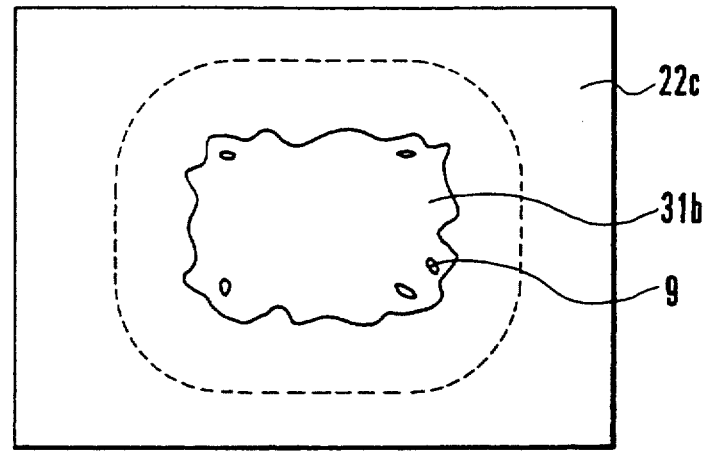
Figure 6J:
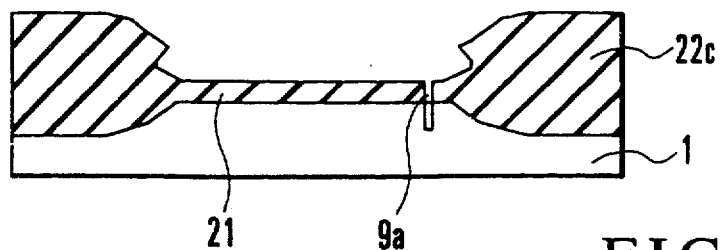
Figure 6K:
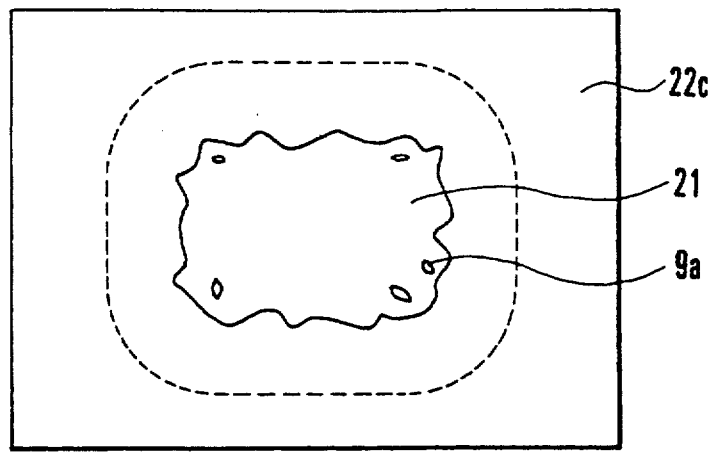
Figure 7H:
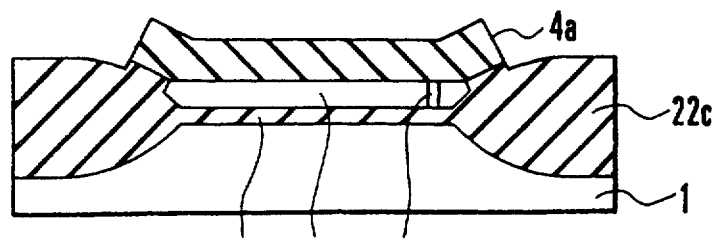
Figure 7I:
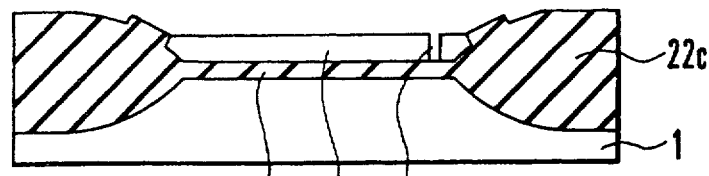
Figure 7J:
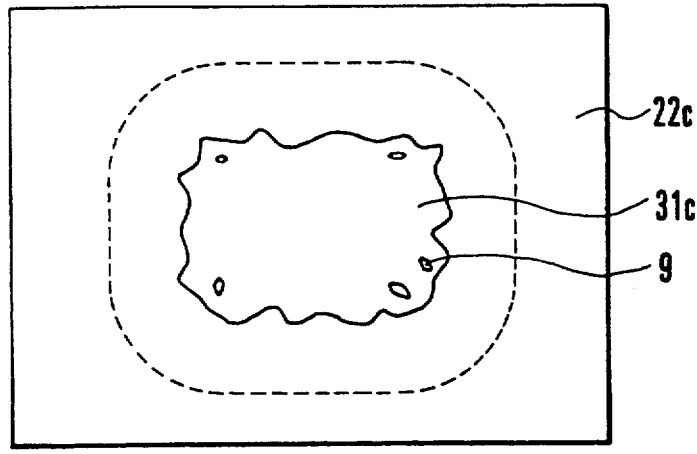
Figure 7K:
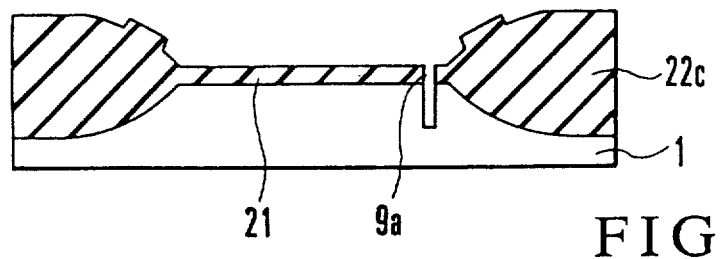
Figure 7L:
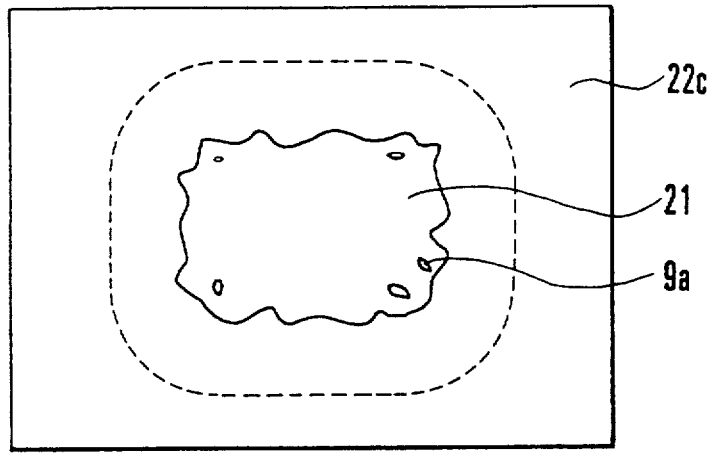

With the above method, no void is formed in the silicon layer constituted by the silicon layers 32a and 33a, and hence no hole is formed in the silicon substrate 1, as shown in FIG. 5K, unlike the conventional methods. In addition, the boundary portion of the oxide film 22a is free from an uneven state.

Since the silicon films 32a and 33a having different oxidation rates are used, unlike the above embodiment 5, the cross-sectional shape of the thick oxide film 22a serving as a field oxide film is in a controlled state.

Note that in the above embodiment 5, the same effect as that of the embodiment 6 can be obtained even by forming a single silicon layer such that nitrogen doped in the layer gradually increases in concentration toward the upper surface.

[Embodiment 7]

In the above embodiment, an undoped amorphous silicon film is used as the silicon film 32a. However, the present invention is not limited to the undoped amorphous silicon film.

As this silicon film 32a, an amorphous silicon film doped with oxygen which increases the oxidation rate may be used to have a doped state different from that of a silicon film 33a.

By using the oxygen-doped amorphous silicon, the growth of polycrystalline grains of the silicon film 32a can be suppressed when the thick oxide film 22 is formed as a field oxide film.

Since the silicon film 32a is doped with oxygen, the rate of oxidation of the silicon film 32a, which starts from a portion under an end portion of an silicon nitride mask 4a is increased. As a result, the difference in oxidation rate between the silicon film 32a and the silicon film 33a doped with nitrogen becomes larger than that in the above embodiment.

For this reason, the inclination of the cross-sectional shape of a thick oxide film 22a can be further reduced while formation of an uneven boundary portion of the oxide film 22a is suppressed.

In the above embodiments 4 to 7, amorphous silicon is used for a silicon layer. However, the same effect as that described above can also be obtained by using microcrystalline polysilicon.

With a low-pressure CVD method, amorphous silicon can be deposited on a silicon oxide layer at a deposition temperature of about 500° C.

In this case, a microcrystalline polysilicon doped with nitrogen can be deposited by setting a deposition temperature of 650° C., introducing an ammonia gas in addition to $SiH_4$ or $Si_2H_6$, and using nitrogen as an impurity.

In the above embodiment, one silicon layer is doped with one impurity. However, the present invention is not limited to this. One silicon layer may be doped with two or more impurities.

If, for example, an amorphous silicon layer doped with oxygen and nitrogen is used as a silicon layer, the oxidation rate is slightly increased, and the growth of crystal grains can be suppressed more effectively.

In this case, if a silicon layer is doped with only oxygen, the growth of crystal grains is not so suppressed without greatly increasing the oxidation rate. On the other hand, if the doping amount of oxygen is increased to suppress the growth of crystal grains more effectively, the oxidation rate will excessively increase.

If, however, a silicon layer is doped with not only oxygen but also nitrogen or carbon, as described above, an excessive oxidation rate can be prevented.

That is, by doping a silicon layer with an impurity which increases the oxidation rate and an impurity which decreases the oxidation rate, oxidation starting from an end portion of the silicon layer in selective oxidation can be controlled with a high precision, and hence the cross-sectional shape of a field oxide film can be controlled more finely.

As has been described above, according to the present invention, in forming a local oxide region (field oxide film) by the LOCOS method, microcrystalline polysilicon doped with an impurity such as nitrogen, carbon, or oxygen or amorphous silicon is used for a silicon layer formed on a thin oxide film (pad oxide film) formed on a semiconductor substrate.

For this reason, the boundary (bird's beak end) of a field oxide film area (element isolation region) is not made uneven, and formation of voids can be suppressed.

In addition, by making a silicon layer have a multilayer structure having different doping materials, the cross-sectional shape of a field oxide film can be controlled.

Similarly, since the impurity doping amount of a silicon layer is changed in the direction of film thickness, the cross-sectional shape of a field oxide film can be controlled.

Furthermore, since a silicon layer is doped with a combination of two or more impurities, the rate of oxidation starting from a silicon layer end portion can be finely controlled, while growth of a crystal can be suppressed. Therefore, the cross-sectional shape of a field oxide film can be controlled more finely.

What is claimed is:
1. A method of forming an element isolation region, comprising the steps of:
    forming an oxide film on a semiconductor substrate;
    forming a silicon buffer layer consisting of silicon doped with an impurity which prevents crystallization of silicon and suppresses oxidation of silicon;
    forming an oxidation-resistant film on said buffer layer;
    selectively removing part of the oxidation-resistant film to form a mask for oxidation consisting of the oxidation-resistant film; and
    forming an element isolation region by oxidizing a portion of said buffer layer and a portion of said semiconductor substrate.

2. A method according to claim 1, wherein the selective removal step further comprises the additional step of
    selectively removing at least a portion of said exposed buffer layer.

3. A method of forming an element isolation region, comprising:
    forming an oxide film on a semiconductor substrate;
    forming a silicon buffer layer of silicon doped with an impurity that inhibits the growth of crystal grains and promotes oxidation of said buffer layer on said oxide film;
    forming an oxidation-resistant film on said buffer layer;
    selectively removing part of the oxidation-resistant film to form a mask for oxidation consisting of the oxidation-resistant film; and
    forming an element isolation region by oxidizing a portion of said buffer layer and a portion of said semiconductor substrate.

4. The method according to claim 3, wherein the selective removal step further comprises the additional step of selectively removing a portion of said exposed buffer layer.

5. The method according to claim 1, wherein the impurity in said buffer layer includes at least one element selected from the group consisting of nitrogen and carbon as the impurity for doping said buffer layer.

6. The method according to claim 2, wherein the impurity in said buffer layer includes at least one element selected from the group consisting of nitrogen and carbon as the impurity for doping said silicon buffer layer.

7. The method according to claim 3, wherein the step of forming said buffer layer includes oxygen as the impurity for doping said buffer layer.

8. The method according to claim 4, wherein the step of forming said buffer layer includes oxygen as the impurity for doping said buffer layer.

9. The method according to claim 1, wherein the step of forming said buffer layer includes doping said buffer layer with an impurity of varying concentration relative to the layer thickness of said buffer layer.

10. The method according to claim 1, wherein said buffer layer is a multilayer structure having at least a first layer and a second layer, wherein said first and second layers differ from each other at least either in the type or concentration of the doped impurity.

11. The method according to claim 10, wherein said first layer of said buffer layer exhibits a higher oxidation rate than said second layer of said buffer layer.

12. The method according to claim 2, wherein the step of forming said silicon buffer layer includes doping said buffer layer with an impurity of varying concentration relative to the layer thickness of said buffer layer.

13. The method according to claim 2, wherein said silicon buffer layer is a multilayer structure having at least a first layer and a second layer, wherein said first and second layers differ from each other at least either in the type or concentration of the doped impurity.

14. The method according to claim 13, wherein said layer of said buffer layer exhibits a higher oxidation rate than said second layer of said buffer layer.

15. The method according to claim 3, wherein the step of forming said silicon buffer layer includes the step of doping said buffer layer with an impurity of varying concentration relative to the layer thickness of said silicon layer.

16. The method according to claim 3, wherein said buffer layer is a multilayer structure having at least a first layer and a second layer, wherein said first and second layers differ from each other at least either in the type or concentration of the doped impurity.

17. A method according to claim 16, wherein said first layer of said buffer layer exhibits a higher oxidation rate than said second layer of said buffer layer.

18. The method according to claim 4, wherein the step of forming said silicon buffer layer includes doping said silicon buffer layer with an impurity of varying concentration relative to the layer thickness of said buffer layer.

19. The method according to claim 4, wherein said buffer layer is a multilayer structure having at least a first layer and a second layer, wherein said first and second layers differ from each other at least either in the type or concentration of the doped impurity.

20. The method according to claim 19, wherein said first layer of said buffer layer exhibits a higher oxidation rate than said second layer of said buffer layer.

* * * * *

UNITED STATES PATENT AND TRADEMARK OFFICE
CERTIFICATE OF CORRECTION

PATENT NO. : 5,631,189
DATED : May 20, 1997
INVENTOR(S) : Kobayashi et al.

Page 1 of 10

It is certified that error appears in the above-identified patent and that said Letters Patent is hereby corrected as shown below:

In the title page, item [30] Foreign Application Priority Data, please insert --

June 8, 1995     [JP]   Japan .................... 7-141732 --.

In the drawing sheets, please delete sheets 2, 4, 6, 8, 10, 12, 13, 15, and 16 and insert the new drawing sheets which are attached herewith. The Figures affected are 1H-1I, 2H-2I, 3I-3J, 4I-4J, 5I-5J, 6H, 6J, 7I, and 7K.

Signed and Sealed this

Twelfth Day of May, 1998

Attest:

BRUCE LEHMAN

*Attesting Officer*    *Commissioner of Patents and Trademarks*